(12) United States Patent
Aoki

(10) Patent No.: US 7,768,345 B2
(45) Date of Patent: Aug. 3, 2010

(54) AMPLIFIER

(75) Inventor: Yuuichi Aoki, Minato-ku (JP)

(73) Assignee: NEC Corporation, Tokyo (JP)

( * ) Notice: Subject to any disclaimer, the term of this patent is extended or adjusted under 35 U.S.C. 154(b) by 490 days.

(21) Appl. No.: 10/585,206

(22) PCT Filed: Dec. 27, 2004

(86) PCT No.: PCT/JP2004/019526

§ 371 (c)(1),
(2), (4) Date: Jul. 3, 2006

(87) PCT Pub. No.: WO2005/067139

PCT Pub. Date: Jul. 21, 2005

(65) Prior Publication Data

US 2007/0164824 A1   Jul. 19, 2007

(30) Foreign Application Priority Data

Jan. 5, 2004 (JP) ............................. 2004-000672

(51) Int. Cl.
*H03F 1/00* (2006.01)
(52) U.S. Cl. .................... 330/133; 330/285; 330/296
(58) Field of Classification Search ............... 330/296, 330/133, 285; 333/14
See application file for complete search history.

(56) References Cited

U.S. PATENT DOCUMENTS

| | | | |
|---|---|---|---|
| 5,781,069 A * | 7/1998 | Baskin | 330/149 |
| 5,808,511 A * | 9/1998 | Kobayashi | 330/149 |
| 5,917,375 A * | 6/1999 | Lisco et al. | 330/151 |
| 6,304,145 B1 * | 10/2001 | Laureanti et al. | 330/285 |
| 6,369,656 B2 * | 4/2002 | Dening et al. | 330/296 |
| 6,469,581 B1 * | 10/2002 | Kobayashi | 330/295 |
| 6,486,739 B1 * | 11/2002 | Luo | 330/288 |

FOREIGN PATENT DOCUMENTS

| | | |
|---|---|---|
| JP | 60-157305 A | 8/1985 |
| JP | 07-022849 A | 1/1995 |
| JP | 7-245529 A | 9/1995 |
| JP | 07-273559 A | 10/1995 |
| JP | 8-84027 A | 3/1996 |

(Continued)

*Primary Examiner*—Benny Lee
*Assistant Examiner*—Alan Wong
(74) *Attorney, Agent, or Firm*—Sughrue Mion, PLLC

(57) ABSTRACT

The present invention provides compensation for distortions in a multi-stage amplifier having a gain expansion characteristic. The present invention also provides an approach for using an amplification stage biased in a state close to B-class, which exhibits high power with added efficiency at low output, in order to have a gain expansion characteristic in all stages of a multi-stage amplifier. The amplifier of the present invention has a gain expansion characteristic which presents an increase in gain in response to an increase in input power or output power in a certain range of the input power or the output power. The amplifier is characterized in that an emitter grounded amplifier circuit comprising a first bipolar transistor has a base terminal to which an input matching circuit and a cathode of a first diode for supplying a bias voltage are connected through a first impedance element which does not block a direct current, and the first diode has an anode which is connected to a reference power supply which presents a sufficiently low impedance at high frequencies.

23 Claims, 40 Drawing Sheets

FOREIGN PATENT DOCUMENTS

| | | |
|---|---|---|
| JP | 09-260964 A | 10/1997 |
| JP | 10-075130 A | 3/1998 |
| JP | 10-135750 A | 5/1998 |
| JP | 2000-183663 A | 6/2000 |
| JP | 2001-313531 A | 11/2001 |
| JP | 2002-084144 A | 3/2002 |
| JP | 2002-111400 A | 4/2002 |
| JP | 2002-171145 A | 6/2002 |
| JP | 2003-037451 A | 2/2003 |
| JP | 2003-338713 A | 11/2003 |
| WO | 02/19518 A1 | 3/2002 |

* cited by examiner

PRIOR ART

PRIOR ART

Input/output characteristic graph

PRIOR ART

PRIOR ART

PRIOR ART

PRIOR ART

PRIOR ART

AMPLIFIER

This application claims priority from PCT Application No. PCT/JP2004/019526 filed Dec. 27, 2004, and from Japanese Patent Application No. 2004-000672 filed Jan. 5, 2004, which applications are incorporated herein by reference.

TECHNICAL FIELD

The present invention relates to an amplifier, and more particularly, to an amplifier, for use in radio communications to control output power over a wide range, which amplifies input power by a plurality of transistors connected at multiple stages to generate amplified power.

BACKGROUND ART

A power amplifier employing an emitter grounded bipolar transistor indispensably requires a base bias circuit which operates in a manner close to a regulated voltage source. A regulated voltage source is more suitable for a bias circuit than a regulated current source for reasons set forth below.

Consider that an RF input is applied to an emitter grounded bipolar transistor which is applied with a bias at a base from a regulated voltage source. When input power is sufficiently small, this emitter grounded bipolar transistor presents a small-signal operation, so that its collector current is substantially equal to a so-called collector bias current which flows when no signal is supplied to an amplifier.

Contrary to the above, as the input power is gradually increased, the collector current of the emitter grounded bipolar transistor increases to a current several times or more larger than the collector bias current. This increase in the collector current realizes higher saturation output and low distortions.

On the other hand, when a bias is applied to the base from a regulated current source, the collector current is maintained to be hFE times as large as the base bias current at all times, so that the collector current will not be increased even if the input power is increased. Therefore, when the collector bias current is set equivalent to the base bias applied by a regulated voltage source, gain compression, experienced in large-current operations, occurs at lower input power. In other words, the saturation characteristic is degraded to cause a reduction in power added efficiency and a degradation in linearity.

Also, when the collector bias current is set equivalent to a collector current when a base bias is applied by a regulated voltage source and when the input power is large, a collector current flows even when no RF signal is supplied and the input power is small, thus giving rise to a problem of increased power consumption and the like.

For the foregoing reasons, a power amplifier employing an emitter grounded bipolar transistor indispensably requires a base bias circuit which operates in a manner close to a regulated voltage source. As a conventional example of the base bias circuit which operates in a manner close to a regulated voltage source, there is a first conventional amplifier described in Japanese Patent No. 3377675. This is illustrated in FIG. 1. The operation of this circuit will be described in accordance with an embodiment of Japanese Patent No. 3377675.

FIG. 1 (see FIG. 1 in Japanese Patent No. 3377675) is a circuit diagram of the first conventional amplifier of Japanese Patent No. 3377675, FIG. 2 (see FIG. 2 in Japanese Patent No. 3377675) is a graph showing a voltage applied to the base of a transistor and to a diode in the circuit illustrated in FIG. 1, and FIG. 3 (see FIG. 3 in Japanese Patent No. 3377675) is a graph showing input/out When an emitter grounded amplifier comprising a bipolar transistor is used as a linear amplifier, to provide an applied voltage at B1 point on the base side, a voltage applied from external voltage source VB is converted to an arbitrary voltage value, for example, through a resistor division using resistors R1 and R2, and then diode D1 is inserted between B2 point and B1 point in the figure such that B1 point opposes a cathode terminal of the diode, as illustrated in FIG. 1.put characteristics of the circuit of FIG. 1. Simultaneously, a capacitor C1 is inserted between B2 point and a ground potential, such that the resulting impedance value is sufficiently small as compared with an impedance when a bias resistor side is viewed from B2 point.

When the operation point of emitter grounded transistor Tr1 in FIG. 1 is set in an A-class region, transistor Tr1 is in a linear operation state to present constant phase excursions for both gain and input/output power when the input power has a sufficiently small voltage as indicated by V1 in FIG. 5 (see FIG. 9 in Japanese Patent No. 3377675), and when the input power has a voltage amplitude which does not exceed a potential difference between bias voltage VB1 applied to B1 point and ON voltage $V_{th}$ of the base-emitter diode. However, when voltage amplitude V2 at B1 point increases, as the input power increases, and exceeds the potential difference between bias voltage VB1 applied to the aforementioned B1 point and ON voltage $V_{th}$ of the base-emitter diode, as indicated by V2 in FIG. 5, transistor Tr1 enters a non-linear operation state, and cannot maintain the operation point as the A-class, so that the power gain gradually decreases. Also, when a voltage value at B1 point swings to a potential equal to or lower than ON voltage $V_{th}$ of the base-emitter diode, an ON-state time and an OFF-state time occur between the base and emitter of the aforementioned transistor Tr1.

In the On state, the input impedance of the base-emitter diode is equal to that when the A-class operation point is maintained, whereas in the OFF state, the input impedance of the base-emitter diode is higher, as compared with that when the A-class operation point is maintained, causing the voltage value at B1 point to largely swing to the negative side in this event. When the A-class operation point is maintained, the voltage value at B1 point is constant at $V_{B1}$, when averaged over time, whereas in the OFF state, the voltage value at B1 point is smaller than $V_{B1}$, when averaged over time. A junction capacitance value of the base-emitter diode has voltage dependence. Therefore, fluctuations in a voltage applied between the base and emitter result in fluctuations in the junction capacitance of the base-emitter diode, so that the input impedance of the emitter grounded amplifier presents a value different from that when the input power is sufficiently small and the A-class operation is maintained.

On the other hand, the potential at B2 point is determined by a voltage value of the regulated voltage source and a division ratio of resistors R1, R2, and is not affected by an increase in the input power, so that if the potential at B1 point gradually becomes lower than that during the small-signal operation as mentioned above, a voltage value VBE2 applied across diode D1 shown in FIG. 1 gradually increases as shown in FIG. 2. Accordingly, the junction capacitance possessed by diode D1 within the bias circuit exhibits fluctuations reverse to fluctuations in the junction capacitance of the base-emitter diode of the aforementioned emitter grounded transistor Tr1. Therefore, as the input power gradually increases, the input power increases in amplitude, accompanied with fluctuations in the input impedance of emitter grounded transistor Tr1, however, the impedance of diode D1 fluctuates to cancel them out, thus making it possible to restrain fluctuations in the input impedance of emitter grounded transistor Tr1 and reduce a pass phase excursion as compared with the conventional circuit. Further, as an increase in the voltage value applied across diode D1 causes an increase in the value of a current which flows into the base of transistor Tr1 through diode D1, the collector current increases, making it possible to solve saturated output power at the collector terminal and to increase a reduction in the power gain as well.

However, as the input power becomes higher to cause an increase in the bias current flowing into diode D1, the voltage becomes lower due to a voltage drop caused by resistor R1, and even the potential at B2 point in FIG. 2 becomes lower, so that the circuit can no longer operate as a regulated voltage source. There is therefore a first problem that the current flowing through resistor R2 must be increased to such a degree that the current flowing into diode D1 can be neglected.

This first problem is alleviated by a second conventional amplifier of FIG. 4, which is described in FIG. 4 in the same Japanese Patent No. 3377675. In FIG. 4, bipolar transistor Tr2 is connected between B2 point of a base bias circuit for dividing supply voltage VB with resistors R1, R2 and the base of transistor Tr1 such that the base-emitter of transistor R2 is oriented in the forward direction, and supply voltage VC is applied to the collector of transistor Tr2. Capacitor C1 is inserted between point B2 in the base bias circuit, i.e., the base terminal of transistor Tr2, and a ground point to present an impedance sufficiently smaller than an impedance when bias resistors R1, R2 are viewed from the base.

This second conventional amplifier utilizes a PN junction between the base and emitter of transistor Tr2, in contrast to that which utilizes a PN junction of diode D1 arranged in the base bias circuit illustrated in FIG. 1, wherein the operation of the circuit is substantially the same as the first conventional amplifier in which diode D1 is arranged in the base bias circuit, as illustrated in FIG. 1. However, since the aforementioned transistor Tr2 forms an amplifier circuit, the base bias current is amplified by this transistor Tr2, and is supplied to the base of emitter grounded transistor Tr1. It is therefore possible to reduce the current which flows into the base bias circuit, composed of the aforementioned resistors R1, R2, for generating the original base bias.

Though reduced, however, the second conventional amplifier is similar to the first conventional amplifier in that it suffers from the first problem that the current flowing through resistor R2 must be increased to such a degree that the current flowing into the base of transistor Tr2 can be neglected. Further, since the emitter grounded bipolar transistor exhibits an extremely high mutual conductance, the base must be applied with a strictly regulated voltage. However, in the first and second bias circuits, which generate this voltage through resistance division using resistors R1, R2, a second problem arises in that they are strongly affected by fluctuations in voltage between the base and emitter due to the temperature, variations attributable to the manufacturing, and the like.

It is a third conventional amplifier described in JP-A-2002-9559 that alleviates the first and second problems. FIG. 6 (see FIG. 5 in JP-A-2002-9559) illustrates a circuit diagram of the third conventional amplifier. In the third conventional amplifier, resistor 18 is not directly grounded, but is grounded through a reference voltage circuit composed of bipolar transistor Tr19 and bipolar transistor Tr20. The potential at a base of bipolar transistor Tr19 is equal to the sum of VBE of bipolar transistor Tr20 and VBE of bipolar transistor Tr19.

This circuit is designed such that the collector current density of bipolar transistor Tr20 is equal to the collector current density of power transistor Tr22. Therefore, VBE of power transistor Tr20 is equal to VBE of power transistor Tr22.

A base current of power transistor Tr22 is set equal to an emitter current of bipolar transistor Tr21; a base current of bipolar transistor Tr20 is set equal to an emitter current of bipolar transistor Tr19; an emitter area of bipolar transistor Tr20 is set equal to that of bipolar transistor Tr19; and an emitter area of power transistor Tr22 is set larger than that of bipolar transistor Tr21. Accordingly, VBE of bipolar transistor Tr21 is higher than VBE of bipolar transistor Tr19. The voltage drop of resistor 18 is equal to the difference between VBE of bipolar transistor Tr21 and VBE of bipolar transistor Tr19.

Assuming herein that DC current amplification ratios of the transistors are all equal to β for simplicity,

[Equation 1]

$$IC_{Tr22} = \beta^2 \cdot IB_{Tr21} = \beta^2 \cdot \left\{ I_{ref} - IC_{Tr20}\left(1 + \frac{1}{\beta^2}\right) \right\} \quad (1)$$

Here, from the fact that the amplifier is designed such that the collector current density of bipolar transistor Tr20 is equal to the collector current density of power transistor Tr22, the relationship between $IC_{Tr22}$ and $IC_{Tr20}$ is equal to the relationship between power transistor Tr22 and bipolar transistor Tr20 in regard to the area ratio. When $S_{22}$ designates the area of power transistor Tr22, and $S_{20}$ the area of bipolar transistor Tr20,

[Equation 2]

$$IC_{Tr22} = \frac{1}{\frac{1}{\beta^2} + \frac{S_{22}}{S_{20}}\left(1 + \frac{1}{\beta^2}\right)} \cdot I_{ref} \quad (2)$$

When $\beta^2 \gg 1$, the circuit serves as a current source with $IC_{Tr22} \approx (S_{22}/S_{20})I_{ref}$.

This circuit can alleviate the aforementioned second problem because changes in VBE's due to the temperature and variations attributable to the manufacturing cancel each other out. Also, in regard to the aforementioned first problem, the circuit can operate in a manner close to a regulated voltage source because a reduction in VBE of power transistor Tr22 does not affect VBE of bipolar transistor Tr20, and they do not cancel each other out.

Here, $I_{ref}$ is given by:

[Equation 3]

$$I_{ref} = \frac{VB - VBE_{Tr21} - VBE_{Tr22}}{R17} \quad (3)$$

and is therefore affected by fluctuations in VBE.

However, the bias circuit of the second conventional amplifier illustrated in FIG. 4 has the first problem that the current flowing through resistor R2 must be increased to such a degree that the current flowing into the base of transistor Tr2 can be neglected, whereas in the bias circuit of the third conventional amplifier in FIG. 6, since the value of Iref can be reduced if a large area ratio is selected, the value of R17 can be increased to keep fluctuations small.

The foregoing consideration has been made in regard to an amplifying transistor biased to A-class in accordance with an embodiment of Japanese Patent No. 3377675. In the following, a description will be given of those conventional amplifiers when they are biased to B-class or to AB-class close to B-class. In CDMA portable telephone terminals such as W-CDMA, output power is controlled in excess of 50 dB in order to avoid a near-far problem (problem that communications cannot be made with a remote terminal due to the influence of radiowaves from neighboring terminals). Therefore, communications are made with low power at an increased frequency in a region where a large number of base stations are installed. The ratio of power consumption to the output power in low-power transmission is lower as the operation of an amplifier is brought closer to B-class from A-class. In other words, a higher power added efficiency is provided as the amplifier is operated in a state closer to B-class.

Consider now a case in which an emitter grounded amplifier circuit which operates in a manner close to B-class is biased by the aforementioned bias circuit of the first to third conventional amplifier which operates in a manner close to a regulated voltage source. The emitter grounded amplifier circuit, which is biased in a state close to B-class, causes a gain expansion, as shown in FIG. 7, because the base current increases with the input power increasing, due to the rectifying action of the base-emitter diode.

The gain fluctuates when this amplifier having the gain expansion characteristic is applied with a broadband modulated signal associated with a change in power, such as a W-CDMA signal, wherein a third problem arises in that the fluctuations in the gain cause a signal distortion. As shown in FIG. 8, this signal distortion appears to be interfering waves to adjacent channels next to a communications channel. The ratio of a signal strength on the communications channel to the strength of the interfering waves to the adjacent channels is called "adjacent channel power ratio" (ACPR).

As conventional examples for solving the third problem, there are distortion canceling approaches as proposed in JP-A-2000-183663, JP-A-2002-111400, JP-A-2002-171145, and JP-A-10-135750. These approaches has a point common to them in that, as opposed an amplification stage having a gain expansion characteristic shown at a second amplification stage, another amplification stage shown at a first amplification stage is designed to have a gain compression characteristic, thereby canceling out gain fluctuations of the two parties to reduce distortions, as illustrated in FIG. 9. In the following, a description will be given of the cancellation of distortions with the gain expansion amplification stage and gain compression amplification stage.

The amplification characteristic of an arbitrary amplifier is Taylor expanded as shown below:

[Equation 4]

$$V_{out} = \sum_{n} a_n V_{in}^n \qquad (4)$$

When this amplifier is applied with two sinusoidal waves given by:

[Equation 5]

$$V_{in} = A(\sin \omega_1 t + \sin \omega_2 t) \qquad (5)$$

changes occur in the main signal and the distortion component due to the non-linearity of the amplifier.

When (5) is substituted into (4), and Equation (4) is calculated until n=5, a component at a frequency $\omega_1$ of $V_{out}$ is given by:

[Equation 6]

$$V_{out}|_{\omega_1} = \left(a_1 A + \frac{9}{4} a_3 A^3 + \frac{25}{4} a_5 A^5\right) \sin \omega_1 t \qquad (6)$$

Among coefficients of sin, $a_1 A$ represents an amplification ratio (i.e., gain), and the others represent fluctuations in the gain with respect to an input amplitude (i.e., whether gain expansion or gain compression). Also, a frequency component $2\omega_1 - \omega_2$ of $V_{out}$ is given by:

[Equation 7]

$$V_{out}|_{(2\omega_1 - \omega_2)} = \left(\frac{3}{4} a_3 A^3 + \frac{25}{8} a_5 A^5\right) \sin (2\omega_1 - \omega_2)t \qquad (7)$$

(7) expresses a third inter-modulation distortion (IM3) component of $V_{out}$. Here, when $a_1$, $a_3$, $a_5$ have the same sign, (6) shows the gain expansion characteristic, where the gain increases together with input amplitude A over a wide range of A. Also, under the same condition, sin in (7) has the same coefficients as those of sin in (6). Defined this way, a basic wave matches IM3 in phase.

Generally, the phase cannot be defined regarding signals having a different frequency, but in this event, the signal shown in (5) is used for the input, two waves spaced by frequency $(\omega_2 - \omega_1)/2\pi$ from each other match in phase every $2\pi/(\omega_2 - \omega_1)$ seconds. In the same way, since the basic wave and IM3 spaced by $(\omega_2 - \omega_1)/2\pi$ from each other have the same phase angle every $2\pi/(\omega_2 - \omega_1)$ seconds, they are defined by terms "in-phase" and "opposite phase." (6), (7) show that the basic wave and IM3 match in phase when the gain expansion prevails in a wide range of input power.

Here, a distortion canceling phenomenon occurs if the phase of IM3 generated by amplifying distortions of the preceding stage at the subsequent stage differs by ±90 degrees from the phase of IM3 generated by amplifying the basic wave at the subsequent stage. As such, in the following, the phase angle within ±90 degrees between the basic wave and IM3 is expressed by "in phase," and the phase angle larger than ±90 degrees is expressed by "in opposite phase" for simplicity.

FIG. 10 shows, as an example, the relationship of the phase between the basic wave and IM3 signal when the third conventional amplifier illustrated in FIG. 6 is biased to AB-class close to B-class for analysis. Here, the magnitude of the IM3 signal is enlarged by a factor of ten for purposes of illustration because it is small as compared with the basic wave. The absolute value of the phase does not have meaning in particular because it simply represents a delay of input/output. FIG. 11 in turn shows the appearance of the gain expansion in that event.

An input power range drawn in FIG. 10 is indicated by arrows in FIG. 11. In many cases, the basic wave is in phase with IM3 in amplifiers which exhibit the gain expansion characteristic. FIG. 13 shows an exemplary relationship of the phase between the basic wave and IM3 signal when an analysis is made employing a gain expansion amplifier which uses a gain variable amplifier and a multiplier in FIG. 12. Here, the magnitude of IM3 is again enlarged by a factor of ten for purposes of illustration. As shown, the basic wave is in phase with IM3. Also, FIG. 14 shows the appearance of the gain expansion in that event. FIG. 14 shows the gain expansion characteristic.

Conversely, in many cases, the basic wave is in opposite phase to IM3 in amplifiers which exhibit the gain compression characteristic. As is the case with the gain expansion amplifier, FIG. 15 shows an exemplary phase relationship between the basic wave and IM3 signal when an analysis is made employing a gain expansion amplifier which uses the variable gain amplifier (used with the reversed control characteristic of a gain control terminal) and multiplier in FIG. 12. Here, the magnitude of IM3 is again enlarged by a factor of ten for purposes of illustration. As shown, the basic wave is in opposite phase to IM3. Also, FIG. 16 shows the appearance of gain expansion. FIG. 16 shows the gain compression characteristic.

Specifically, distortions can be reduced by a combination of the gain expansion amplification stage with the gain compression amplification stage because the phase angles of the basic wave and IM3 are inverted at respective stages, so that IM3, generated at the preceding stage and amplified at the subsequent stage, has a phase opposite to IM3 generated by amplifying the basic wave at the subsequent stage to cancel them out.

The respective conventional examples attempt to reduce distortions in the following manner. First, in the conventional example described in JP-A-2000-183663, a gate bias to an FET amplifier circuit is set to B-class to have the gain expansion characteristic at a first amplification stage illustrated in FIG. 9, while a gate bias to an FET amplifier circuit is set to AB-class to have the gain compression characteristic at a second amplification stage, thereby canceling out the gain expansion characteristic and gain compression characteristic so as to reduce distortions.

Next, in the conventional example described in JP-A-2002-111400, a base bias to an HBT amplifier circuit is set to AB-class to have the gain expansion characteristic at the first amplification stage in FIG. 9, while a gate bias to an HBT amplifier circuit is set to A-class to have the gain compression characteristic at the second amplification stage, thereby canceling out the gain expansion characteristic and gain compression characteristic so as to reduce distortions.

Then, in the conventional example described in JP-A-2002-171145, a gate bias to an MES amplifier circuit is set to A-class to have the gain compression characteristic at the first amplifier stage in FIG. 9, while a gate bias to a MOS amplifier circuit is set to AB-class to have the gain expansion characteristic at the second amplification stage, thereby canceling out the gain expansion characteristic and gain compression characteristic so as to reduce distortions.

Finally, in the conventional example described in JP-A-10-135750, a base bias to an HBT amplifier circuit is set to AB-class or C-class to have the gain expansion characteristic at the first amplification stage in FIG. 9, while a gate bias to an HBT amplifier is set to A-class to have the gain compression characteristic at the second amplification stage, thereby canceling out the gain expansion characteristic and gain compression characteristic so as to reduce distortions.

For simplicity, these conventional examples are collectively called the "fourth conventional amplifiers." These fourth conventional amplifiers combine the gain expansion amplification stage with the gain compression amplification stage to reduce distortions, and therefore have a fourth problem of the inability to apply an amplifier that exhibits the gain expansion characteristic with good power added efficiency at low output to all amplification stages.

In addition, as conventional examples which attempt to reduce distortions by canceling out phase-rotated distortion components, there is a differential frequency injection technique, as proposed by Japanese Patent No. 3337766, and JP-A-2003-338713.

FIG. 17 is an explanatory diagram for distortion compensation through second-order distortion (differential frequency) injection, shown in FIG. 9 of Japanese Patent No. 3337766. By injecting a differential frequency into a non-linear element, phase-rotated distortion components are canceled out.

Assuming in (4) that an input signal is given by the sum of two sinusoidal waves and a differential frequency therebetween as given by:

[Equation 8]

$$V_{in} = A(\sin \omega_1 t + \sin \omega_2 t + D \cos(\omega_2 - \omega_1)t) \quad (8)$$

(8) is substituted into (4), and Equation (4) is calculated until n=5. Then, a component of a basic wave ($\omega_1$) of $V_{out}$ resulting from the non-linearity of the amplifier is given by:

[Equation 9]

$$V_{out}|_{\omega_1} = \left\{a_1 A + \frac{9}{4} a_3 A^3 \left(1 + \frac{2}{3} D^2\right) + \frac{25}{4} a_5 A^5 \left(1 + \frac{105}{8} D^2 + \frac{15}{8} D^4\right) + a_2 A^2 D + a_4 A^4 \left(6D + \frac{3}{2} D^3\right)\right\} \sin \omega_1 t \quad (9)$$

Also, an IM3($2\omega_1-\omega_2$) component of Vout is given by:

[Equation 10]

$$V_{out}|_{(2\omega_1-\omega_2)} = \left\{\frac{3}{4} a_3 A^3 (1 + D^2) + \frac{25}{8} a_5 A^5 \left(1 + 3D^2 + \frac{2}{5} D^4\right) + 16 a_2 A^2 + \frac{1}{2} a_4 A^4 (9D + 3D^3)\right\} \times \sin (2\omega_1 - \omega_2) t \quad (10)$$

It can therefore be understood that an IM3 component shown in Equation 10 can be reduced in certain input amplitude A by selecting injection amount D to be a (negative) proper value. However, since injection amount D cannot be selected to reduce IM3 independently of the value of input amplitude A, it is necessary to optimize the injection amount by any method such as feed-back, feed-forward or the like.

For simplicity, the conventional examples of Japanese Patent No. 3337766 and JP-A-2003-338713 are collectively called the "fifth conventional amplifiers." The fifth conventional amplifiers have a fifth problem that the injection amount must be adjusted by feed-back, feed-forward or the like because the optimal injection amount depends on the input amplitude.

In summarizing the foregoing, the prior arts have the following problems.

As the third problem mentioned above, the first to third conventional amplifiers have a drawback in which signals are distorted due to the gain expansion when they are used as biased in a state close to B-class in order to increase the power added efficiency at low output.

Also, as the fourth problem mentioned above, the fourth conventional amplifier has a drawback of the inability to employ the amplification stage, which exhibits a good power added efficiency at low output, at all stages due to the third problem mentioned above.

Then, as the fifth problem mentioned above, the fifth conventional amplifier has a drawback that there is a requirement for adjustment of the injection amount through feed-back, feed-forward or the like in the injection of a differential frequency signal due to the dependence of an optimal injection amount on the input amplitude.

DISCLOSURE OF THE INVENTION

It is a first object of the present invention to provide means for inverting distortions for an amplification stage having a gain expansion characteristic.

It is a second object of the present invention to provide an approach for employing amplification stages having a gain expansion characteristic by biasing to a state close to B-class with high power added efficiency at low output at all stages of a multi-stage amplifier.

It is a third object of the present invention to provide an approach for employing amplification stages having the gain expansion characteristic by biasing to a state close to B-class at all stages of a multi-stage amplifier without conducting optimal amount control through feed-back, feed-forward or the like.

An amplifier of the present invention has a gain expansion characteristic which presents an increase in gain in response to an increase in input power or output power in a certain range of the input power or the output power, wherein the amplifier is characterized by having an output characteristic that, when the amplifier is applied with two wave signals at close frequencies, the phase of a third-order inter-modulation distortion rotates 90 degrees or more from the phase of the two wave signals at the instant at which the two wave signals match in phase.

According to the present invention, distortions at respective stages can cancel out each other in a multi-stage amplifier. Also, an amplification stage biased in a state close to B-class, which exhibits high power added efficiency at low output, can be used at all stages of the multi-stage amplifier.

Figure 1:
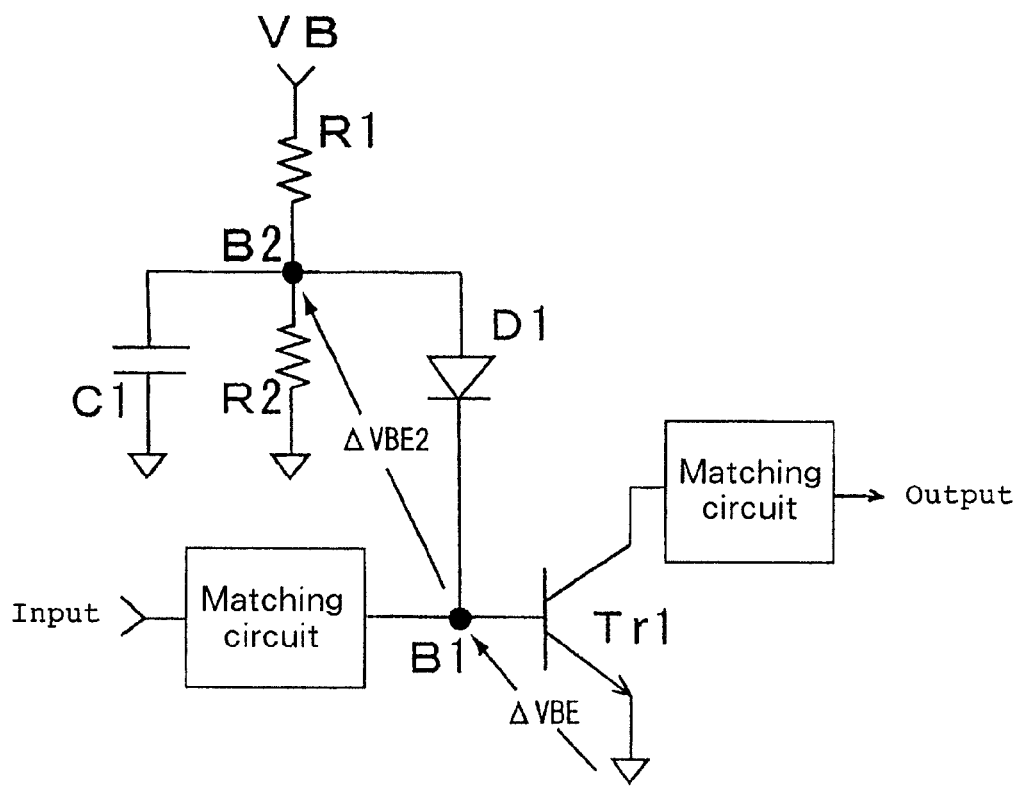
FIG. 1
A circuit diagram for describing a first conventional amplifier.
Figure 2:
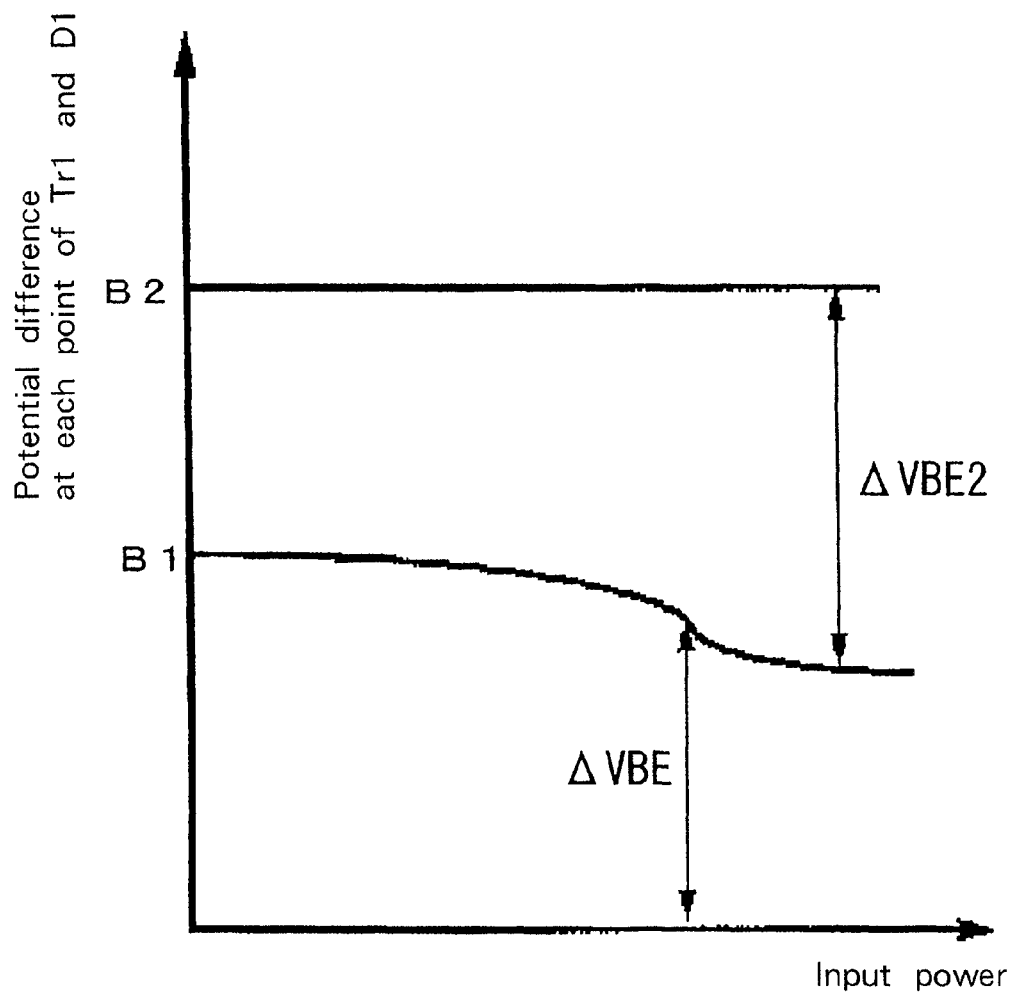
FIG. 2
A diagram for describing a potential difference at each point with respect to the input power of the first conventional amplifier.
Figure 3:
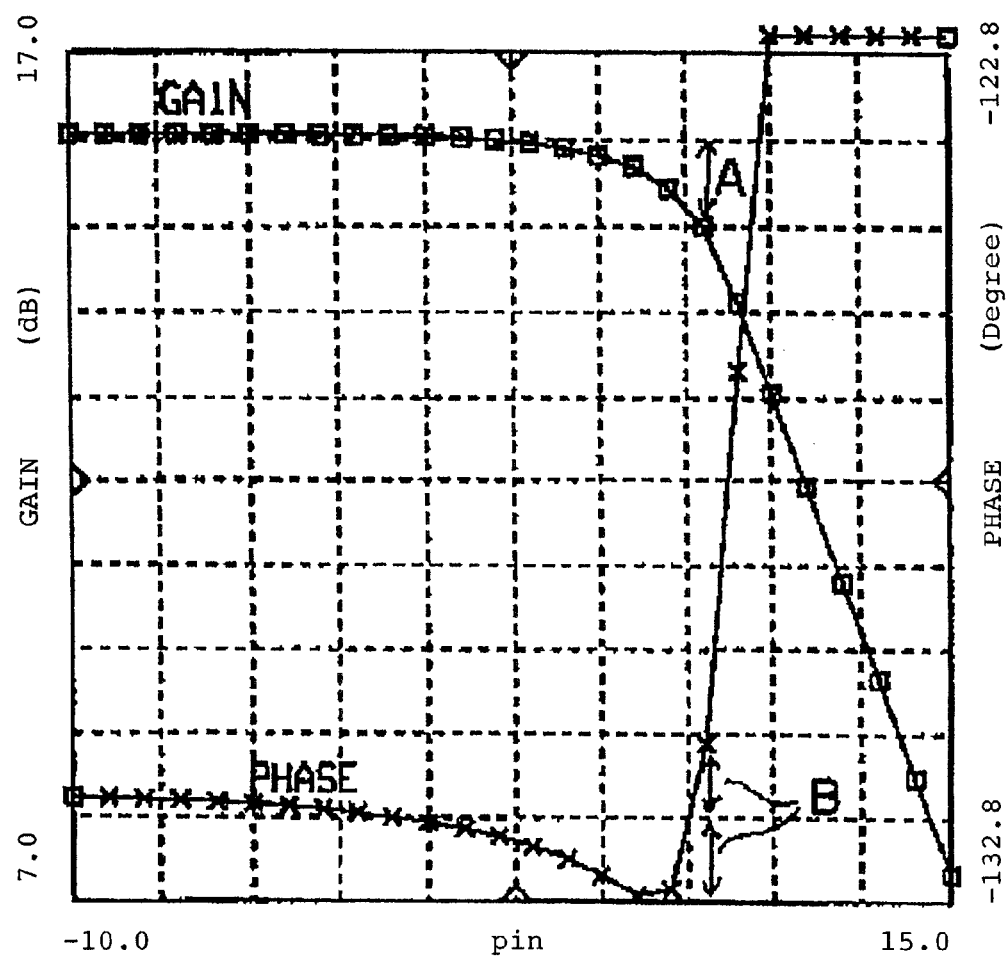
FIG. 3
A diagram for describing fluctuations in gain and phase with respect to the input power of the first conventional amplifier.

A diagram illustrating the second embodiment of the present invention.

FIG. 28

A circuit diagram for describing the second embodiment of the present invention.

FIG. 29

A diagram for describing a phase relationship between the basic wave and distortions in the second embodiment of the present invention.

FIG. 30

A diagram illustrating a third embodiment of the present invention.

FIG. 31

A diagram illustrating a fourth embodiment of the present invention.

FIG. 32

A diagram illustrating a fifth embodiment of the present invention.

FIG. 33

A diagram illustrating a sixth embodiment of the present invention.

FIG. 34

A circuit diagram for describing the sixth embodiment of the present invention.

FIG. 35

A diagram for describing a phase relationship between a basic wave and distortions in the sixth embodiment of the present invention.

FIG. 36

A diagram for describing the relationship between an instantaneous ground of an emitter potential of transistor 26 and a current supplied to an emitter of the same transistor 26 in the sixth embodiment of the present invention.

FIG. 37

A diagram illustrating a concept of distortion cancellation in a multi-stage amplifier in a seventh embodiment of the present invention.

FIG. 38

A diagram illustrating the seventh embodiment of the present invention.

FIG. 39

A circuit diagram for describing the seventh embodiment of the present invention.

FIG. 40

A circuit diagram for describing the seventh embodiment of the present invention.

FIG. 41

A diagram for describing distortion cancellation according to the seventh embodiment of the present invention.

BEST MODE FOR CARRYING OUT THE INVENTION

The principles of the present invention will be first described.

An amplifier of the present invention is an amplifier which amplifies input power to generate output power, and which has a gain expansion characteristic which presents an increase in gain in response to an increase in the input power or the output power within a certain range of the input power or the output power, and the amplifier is characterized by having a mechanism located at an input for compressing an amplitude at high frequencies.

When the present invention is used in a multi-stage amplifier, the multi-stage amplifier amplifies input power to generate output power, and comprises at least two or more amplification stages that have the gain expansion characteristic which presents an increase in gain in response to an increase in the input power or the output power within a certain range of the input power or the output power, and is characterized in that at least one stage of the amplification stages other than a final stage has a mechanism located at an input for compressing an amplitude at high frequencies (in a gain expansion power range).

The conventional example illustrated as the fourth conventional amplifier attempts to reduce distortions by combining a gain expansion amplification stage with a gain compression amplification stage. While this relationship is established in many amplifiers, it is not necessarily essential that distortions can be reduced if the gain expansion amplification stage is combined with the gain compression amplification stage. This is because the characteristic of the amplifier in Equation 4 is that it just indicates the relationship in which an instantaneous input value will assume the value of an instantaneous output value, and does not include an effect of extending the gain, resulting from an increase in bias amount associated with the increase in input power, when the amplifier is biased, for example, close to B-class.

In other words, this means that even with an amplifier with a bias close to B-class, which extends the gain, that results from an increase in bias amount associated with an increase in average input power, the basic wave and IM3 can be inverted in phase by changing the relationship between the instantaneous input value and instantaneous output value. In the amplifier of the present invention, by providing an amplitude compression characteristic which presents a compression in instantaneous amplitude at an input of the amplifier, distortions are canceled out between an amplification stage, which has a gain expansion characteristic and a characteristic in which a basic wave and IM3 have opposite phases to each other, and a normal amplification stage, which has the gain expansion characteristic and has a characteristic in which a basic wave and IM3 are in phase, and distortions that appear in an output are thus reduced. Consequently, an amplification stage which is biased to a state close to highly efficient B-class at low output can be used at all stages of the amplifier.

In order to explain these actions in greater detail, a description will be given of an example in which terminal B2 is biased by a regulated voltage source in the second conventional amplifier illustrated in FIG. 4 (the aforementioned first problem in which there is a reduction in the potential at B2 caused by an increase in the input power is avoided by biasing B2 by the regulated voltage source. In addition, the second problem related to temperature and variations attributable to manufacturing is not taken into account here). When the second conventional amplifier is used with a bias close to B-class, the amplifier can invert distortions in a gain expansion region if certain conditions are satisfied.

Figure 18:
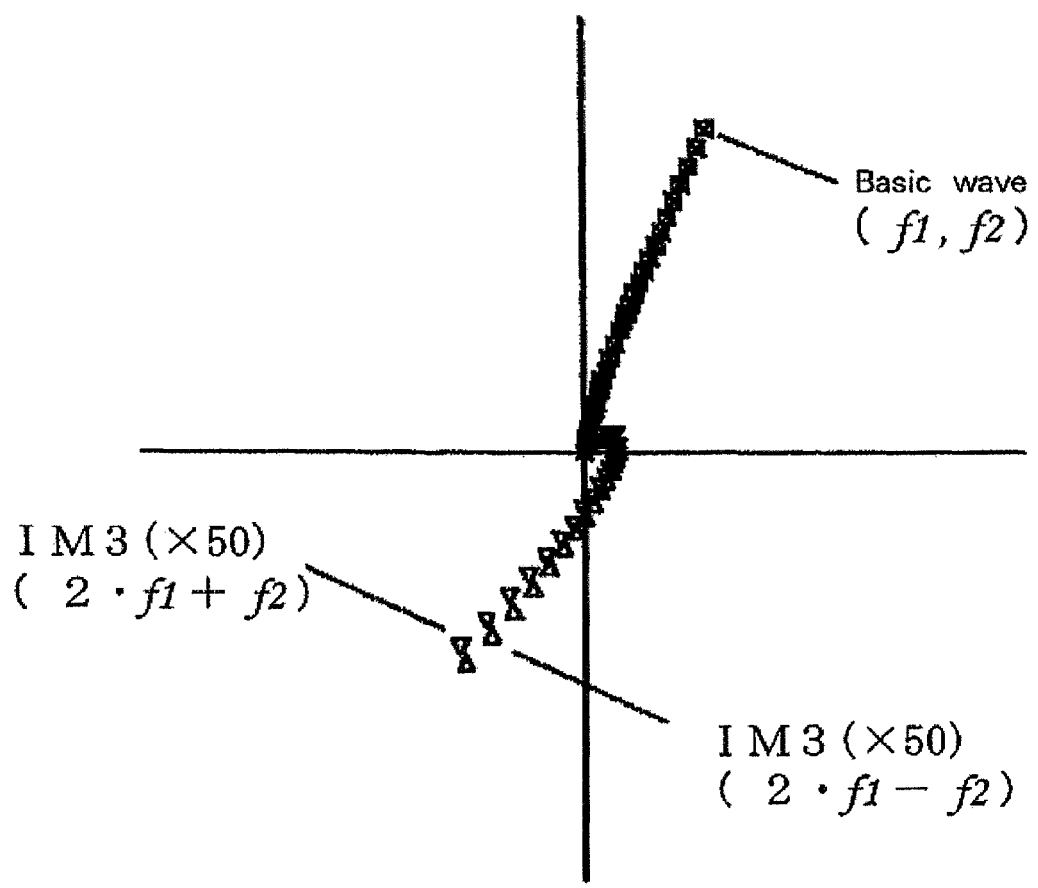
FIG. 18
A diagram for describing a phase relationship between a basic wave and distortions in the second conventional amplifier circuit.
Figure 19:
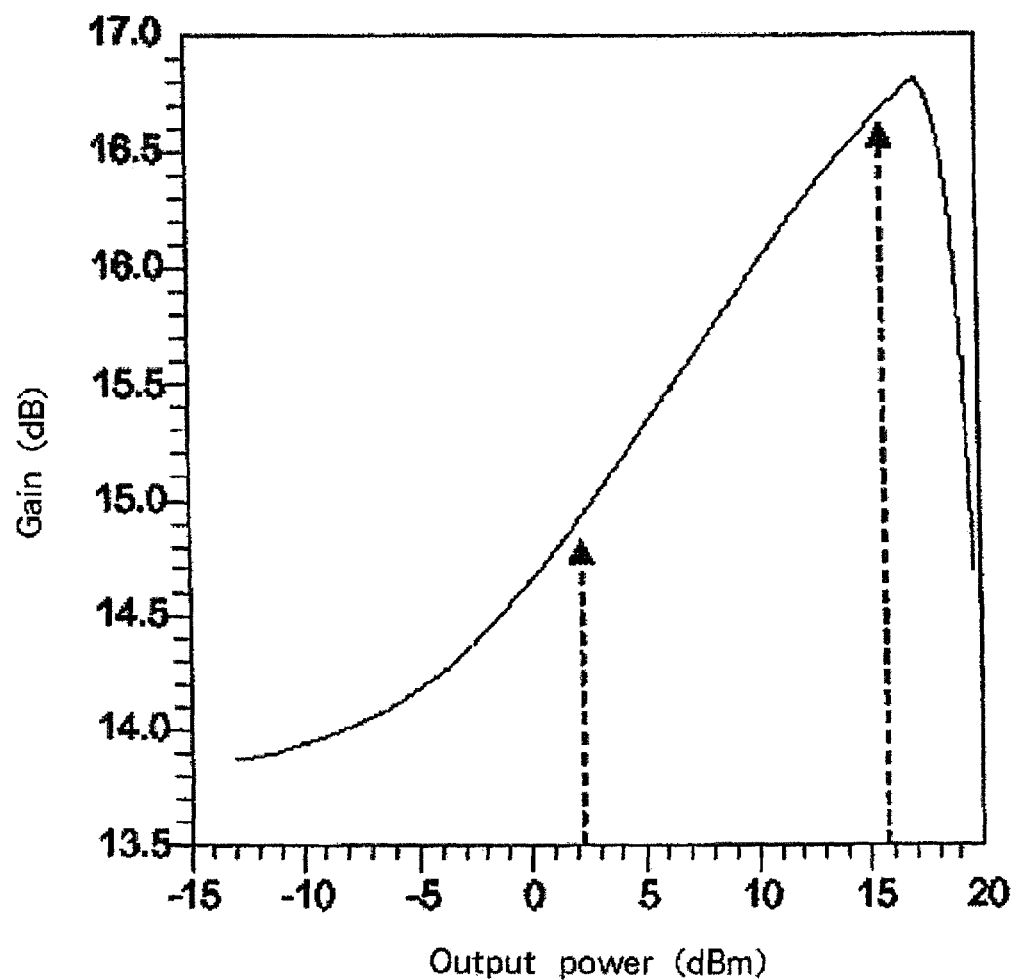
FIG. 19
A diagram for describing the relationship between output power and gain in the second conventional amplifier circuit.

The conditions specify that the size of bias supply transistor Tr2 is 1/10 or more as large as that of amplifying transistor Tr1, and that an input amplitude is large to some degree. FIG. 18 shows a phase relationship between a basic wave and IM3 when amplifier A is analyzed on the assumption that amplifier A presents the ratio of the area of Tr1 to the area of Tr2 equal to 5:1. IM3 is enlarged by a factor of 50 for purposes of illustration. When the input is small, IM3 is initially generated in the same direction as the basic wave, and then is inverted to be reverse to the basic wave. FIG. 19 shows the relationship of output power versus gain in this event. A power range shown in FIG. 18 is extended in gain to output power of 16 dBm or less, so that the basic wave and IM3 have opposite phases to each other even in a gain power range.

Figure 20:
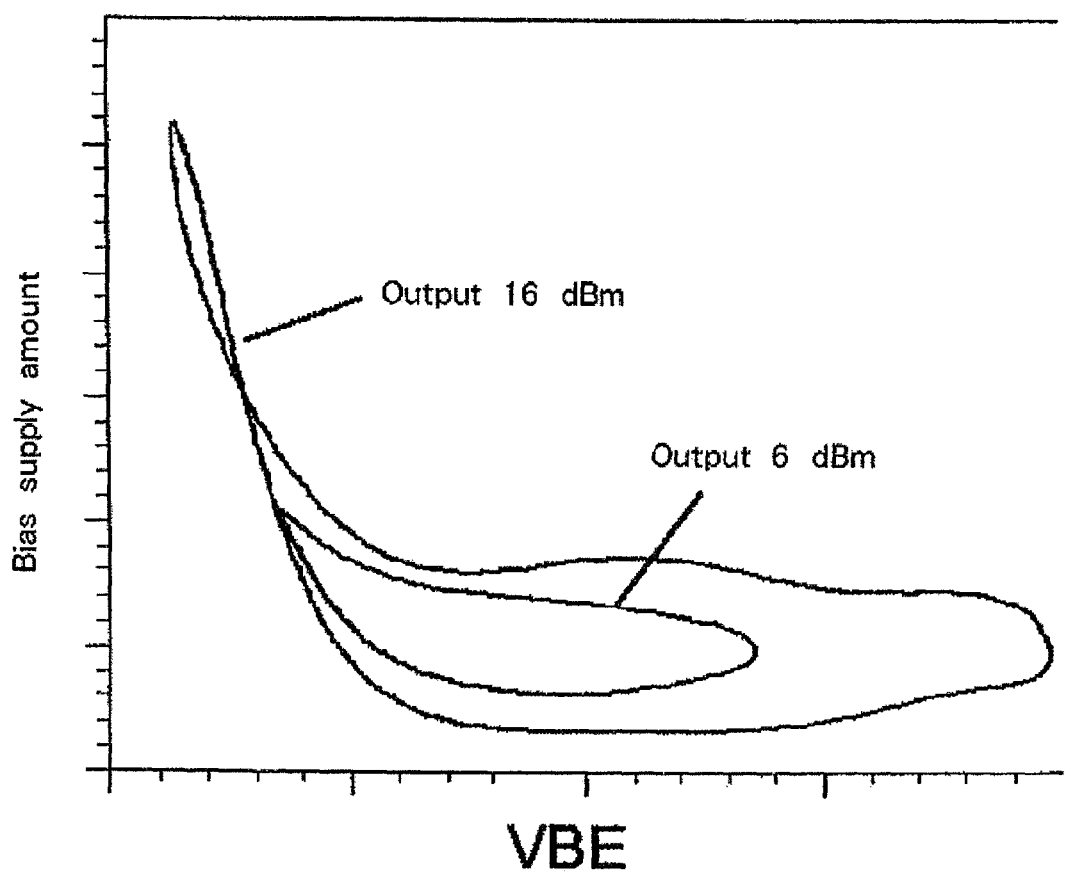
FIG. 20
A diagram for describing the relationship between the base-emitter voltage of transistor Tr1 and the emitter current of transistor Tr2 in the second conventional amplifier circuit.

The phase of IM3 is inverted when the amplitude is large for the following reason. FIG. 20 shows the relationship between an instantaneous value of VBE of transistor Tr1 and a current supplied from the emitter of transistor Tr2. This diagram shows load lines, which represent an internal impedance of transistor Tr2. Two lines shown in the figure represent load lines near a maximum amplitude (at the moment at which two frequencies are just added to each other) when two frequencies are supplied to provide 16 dBm and 6 dBm at the output. As will be seen from the figure, it is understood that, as compared with a small amplitude, when a large amplitude is supplied, the output impedance of Tr2 is extremely small when the base potential is reduced.

This change in impedance causes part of the input signal to leak to the bias circuit, resulting in a compressed instantaneous value of amplitude and inverted phases of the basic wave and IM3 in the output.

Figure 21:
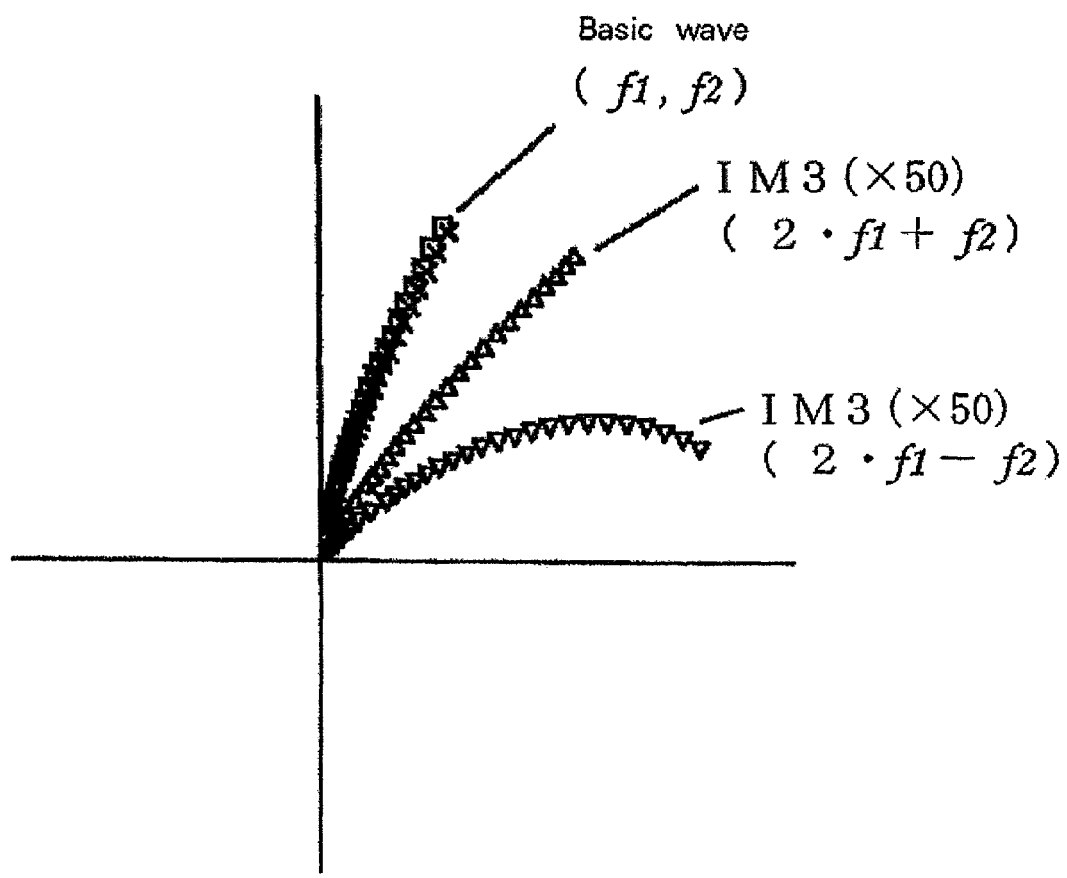
FIG. 21
A diagram for describing a phase relationship between the basic wave and distortions in the second conventional amplifier circuit.
Figure 22:
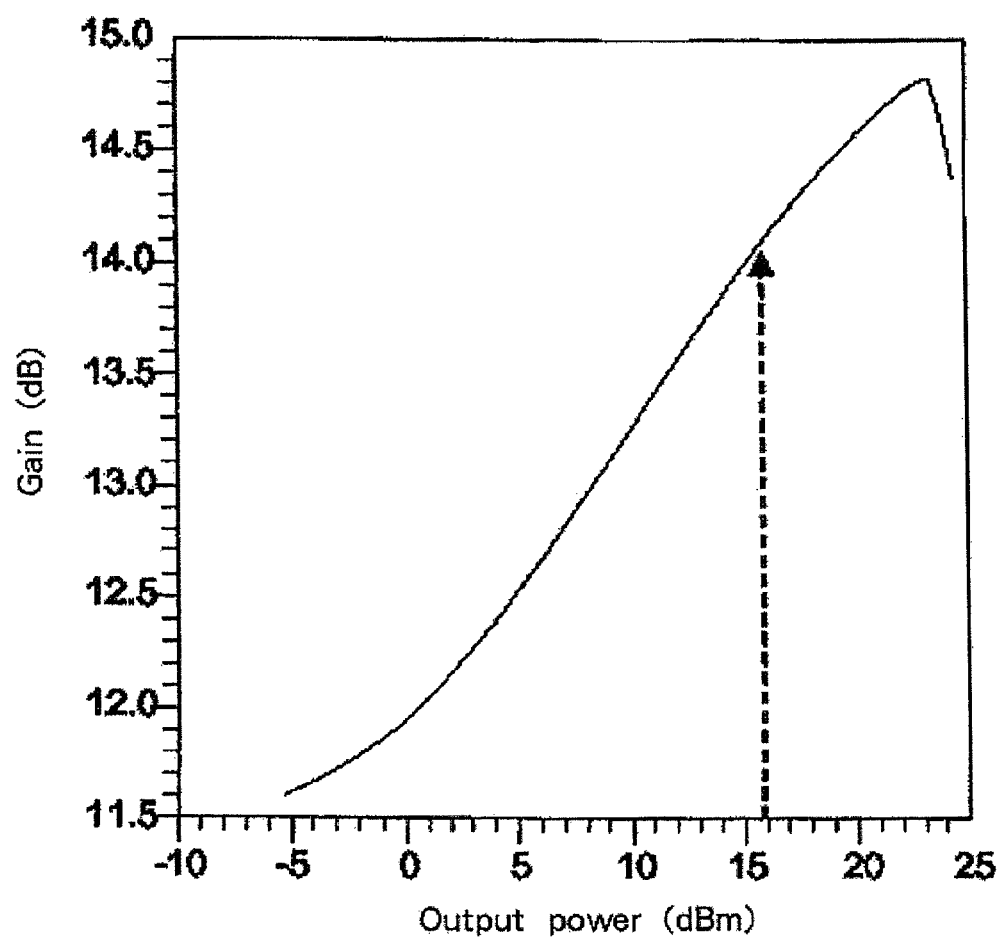
FIG. 22
A diagram for describing the relationship between the output power and gain in the second conventional amplifier circuit.

Assume now that amplifier B is an amplifier in which the area of Tr1 is increased by a factor of 7.2 and the ratio of the area of Tr1 to the area of Tr2 is set to be 36:1. Then, FIG. 21 shows a phase relationship between the base wave and IM3 when amplifier B is analyzed. Likewise, IM3 is enlarged by a factor of 50 for purposes of illustration. FIG. 22 shows the relationship of output power versus gain in this event. A power range shown in FIG. 21 is extended in gain to output power of 16 dBm or less. In this event, the basic wave and IM3 are in phase. This is because the extended area of Tr1 results in a lower input impedance to the base of Tr1, thus making the influence less visible when the impedance of the bias circuit changes to be smaller. This can translate as follows. Since a reduction in the base impedance of Tr1 causes the voltage amplitude to be smaller with the same input power, the input power becomes equivalently higher in order to swing the amplitude until the output impedance of Tr2 is reduced.

Figure 23:
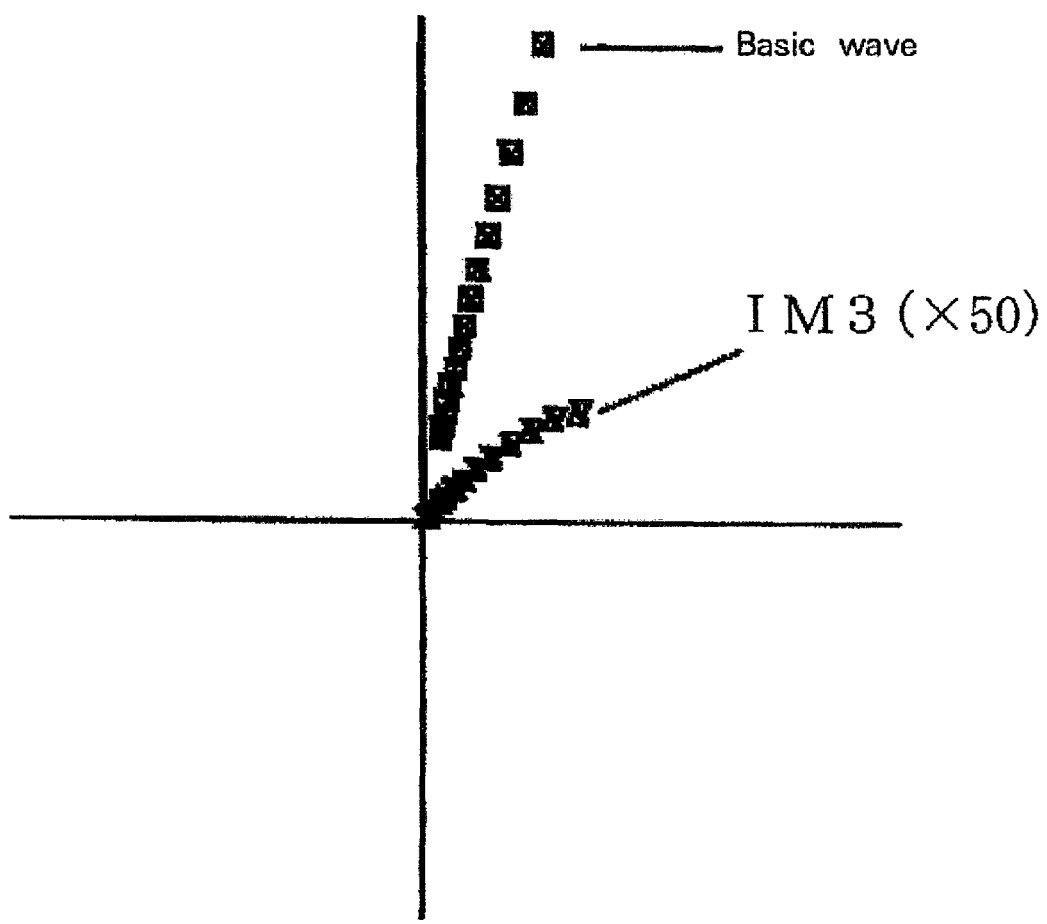
FIG. 23
A diagram for describing a phase relationship between the basic wave and distortions in the second conventional amplifier circuit.

Here, when the basic wave and IM3 have opposite phases to each other in an input power range in amplifier A, while the basic wave and IM3 are in phase in amplifier B, it seems that distortions can be reduced in a two-stage amplifier which employs amplifier A at the front stage and amplifier B at the rear stage, but this is not true. Since it can be seen from FIG. 22 that the gain is approximately 14 dB when the output is 16 dBm, input power of 2 dBm is applied to amplifier B. FIG. 23 shows the relationship between the basic wave and IM3 when amplifier A generates output power of 2 dBm. In this event, since the basic wave and IM3 are in phase, IM3 generated in amplifier A and amplified by amplifier B is added to IM3 generated in amplifier B to increase distortions.

Here, in the amplifier of the present invention, by causing the input impedance on the amplifying transistor side to appear large when viewed from the input terminal, the basic wave and IM3 have opposite phases to each other from a lower input amplitude, so that distortions can be canceled out by the amplifier at the rear stage in which the basic wave and IM3 are in phase. Consequently, the amplification stage biased to a state close to B-class, which is highly efficient at low output, can be used at all stages.

Further, when the present invention is used in a multi-stage amplifier, distortions generated at a former stage are canceled out by distortions generated at a later stage. Generally, since IM3 increases three times more than an increase in input power, the amount of distortion at the former and later stages increase in association. Thus, according to the present invention, a distortion reduction effect can be provided over a wide range of input power without conducting optimal control in accordance with the input power such as feed-back, feed-forward or the like.

Consider now that a triple wave of a main signal is injected, as an example which can reduce distortions of a gain expansion amplifier by providing amplitude compression at an input unit.

In (4), assume that an input signal is the sum of a sinusoidal wave comprising two waves and a triple wave thereof as expressed by:

[Equation 11]

$$V_{in} = A\{\sin \omega_1 t + \sin \omega_2 t + D(\sin 3\omega_1 t + \sin 3\omega_2 t)\} \quad (11)$$

When the triple wave is added to the sinusoidal wave, the triple wave has a peak value in opposite phase at a peak value of the basic value, so that the maximum amplitude is compressed.

When (11) is substituted into (4), and Equation (4) is calculated until n=5, a component of the basic wave ($\omega_i$) of $V_{out}$ caused by the non-linearity of the amplifier is given by:

[Equation 12]

$$V_{out}|_{\omega_1} = \left\{a_1 A + \frac{9}{4}a_3 A^3 \left(1 - \frac{1}{3}D^2 - \frac{4}{3}D^2\right) + \frac{25}{4}a_5 A^5 \left(1 - \frac{5}{4}D + \frac{15}{8}D^2 - \frac{9}{10}D^3 + \frac{9}{5}D^4\right)\right\} \times \sin \omega_1 t \quad (12)$$

On the other hand, an IM3($2\omega_1 - \omega_2$) component of $V_{out}$ is given by:

[Equation 13]

$$V_{out}|_{(2\omega_1 - \omega_2)} = \left\{\frac{3}{4}a_3 A^3(1 - 2D) + \frac{25}{8}a_5 A^5\left(1 - 3D + \frac{18}{5}D^2 - \frac{18}{5}D^3\right)\right\} \sin(2\omega_1 - \omega_2)t \quad (13)$$

It is therefore understood that when a proper value is selected for injection amount D, the IM3 component, given by (13), can be reduced in input amplitude A. In this event, unlike (10), each term can be independently eliminated. For example, when D=0.5, an $a_3$ term in IM3 is zero. Accordingly, distortions can be reduced over a relatively wide range of input amplitude A even if the injection amount is fixed to a certain value.

In the following, specific embodiments will be described.

First Embodiment

Figure 24:
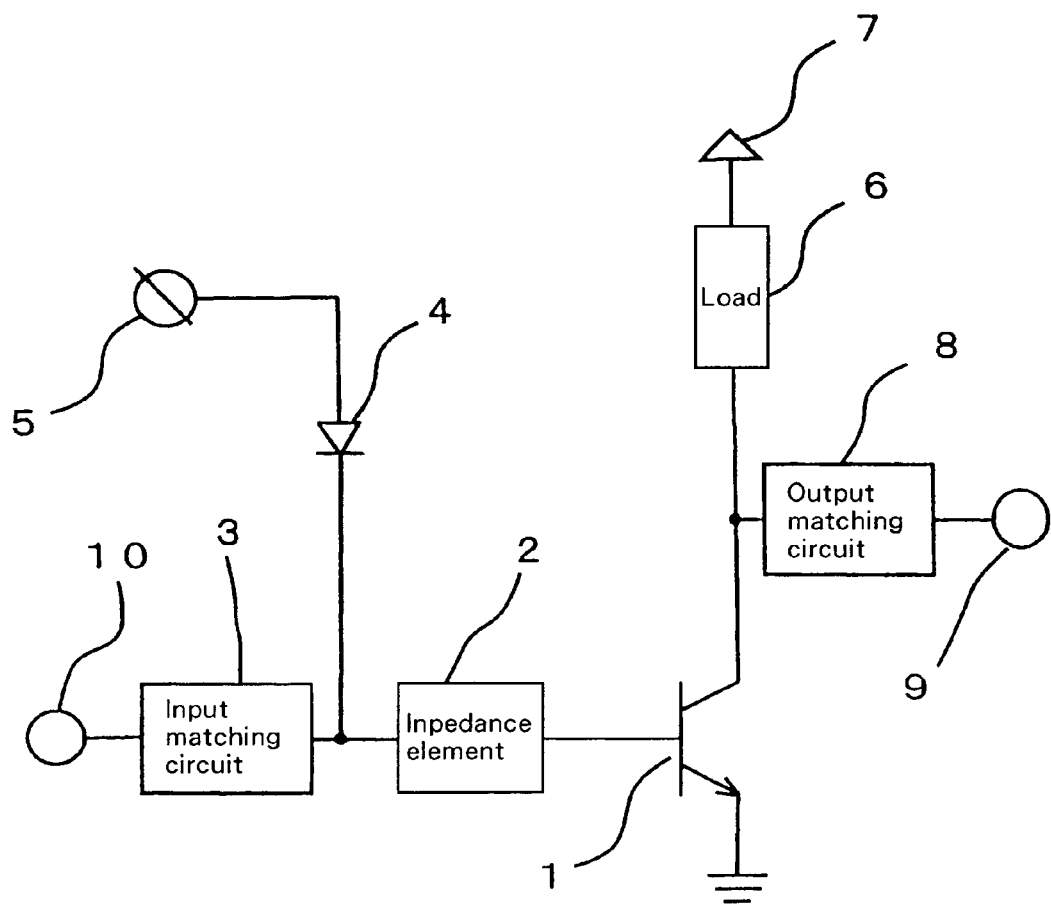
FIG. 24
A diagram illustrating a first embodiment of the present invention.

FIG. 24 is a diagram illustrating an amplifier which inverts the phase of IM3 with respect to a basic wave according to a first embodiment of the present invention. Amplifying transistor 1 forms an emitter grounded amplifier circuit, where transistor 1 has a base, through impedance element 2, which is connected to input matching circuit 3 and to a cathode of bias supply diode 4. Bias supply diode 4 has an anode connected to reference power supply 5 which presents a sufficiently low impedance at high frequencies. Transistor 1 has a collector connected to collector power supply 7 through load 6 and to output terminal 9 through output matching circuit 8.

FIG. 24, which illustrates this embodiment, corresponds to FIG. 1 which illustrates the first conventional example. In comparing the first embodiment illustrated in FIG. 24 with the first conventional example of FIG. 1, bias supply diode D1 has the cathode connected directly to the base terminal of amplifying transistor Tr1 in the prior art, whereas bias supply diode 4 has the cathode connected to amplifying Tr1 through impedance element 2 in this embodiment. By connecting impedance element 2, the input impedance of amplifying transistor 1 is made to appear high, as viewed from input terminal 10, thus achieving a state in which the basic wave and IM3 have opposite phases to each other from low input power. Here, since the bias is supplied to amplifying transistor 1 through impedance element 2, this impedance element 2 does not block a DC current. Since this embodiment is substantially identical to in effect and operation a second embodiment, later described, they will be jointly described in the second embodiment.

Second Embodiment

Figure 4:
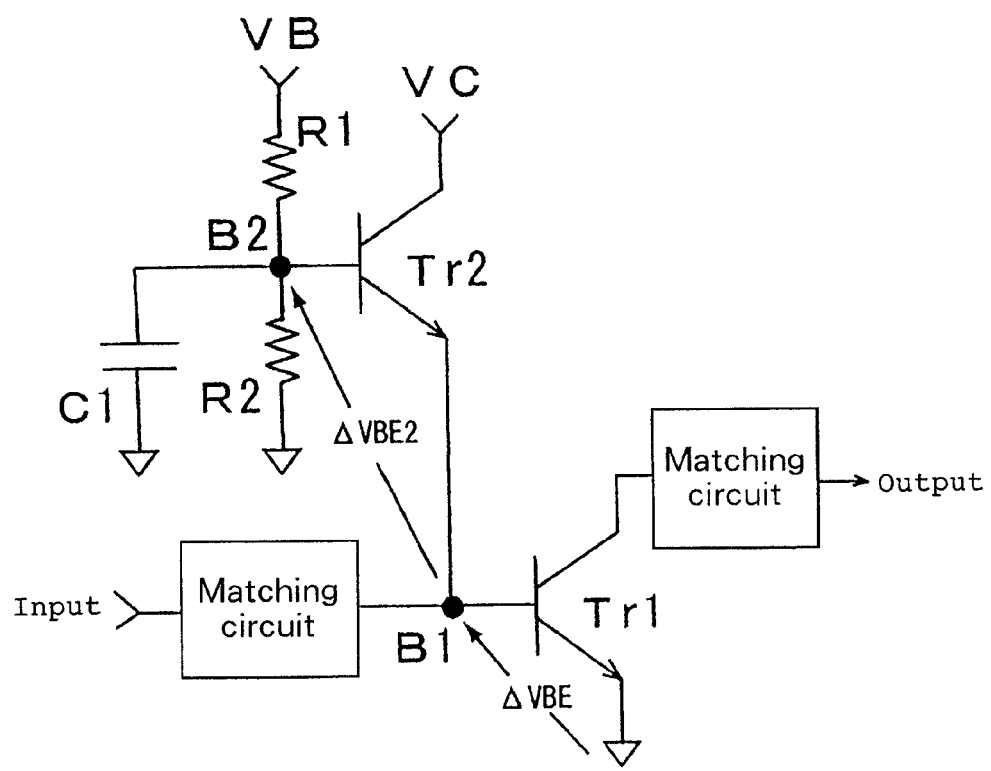
FIG. 4
A circuit diagram for describing a second conventional amplifier.
Figure 5:
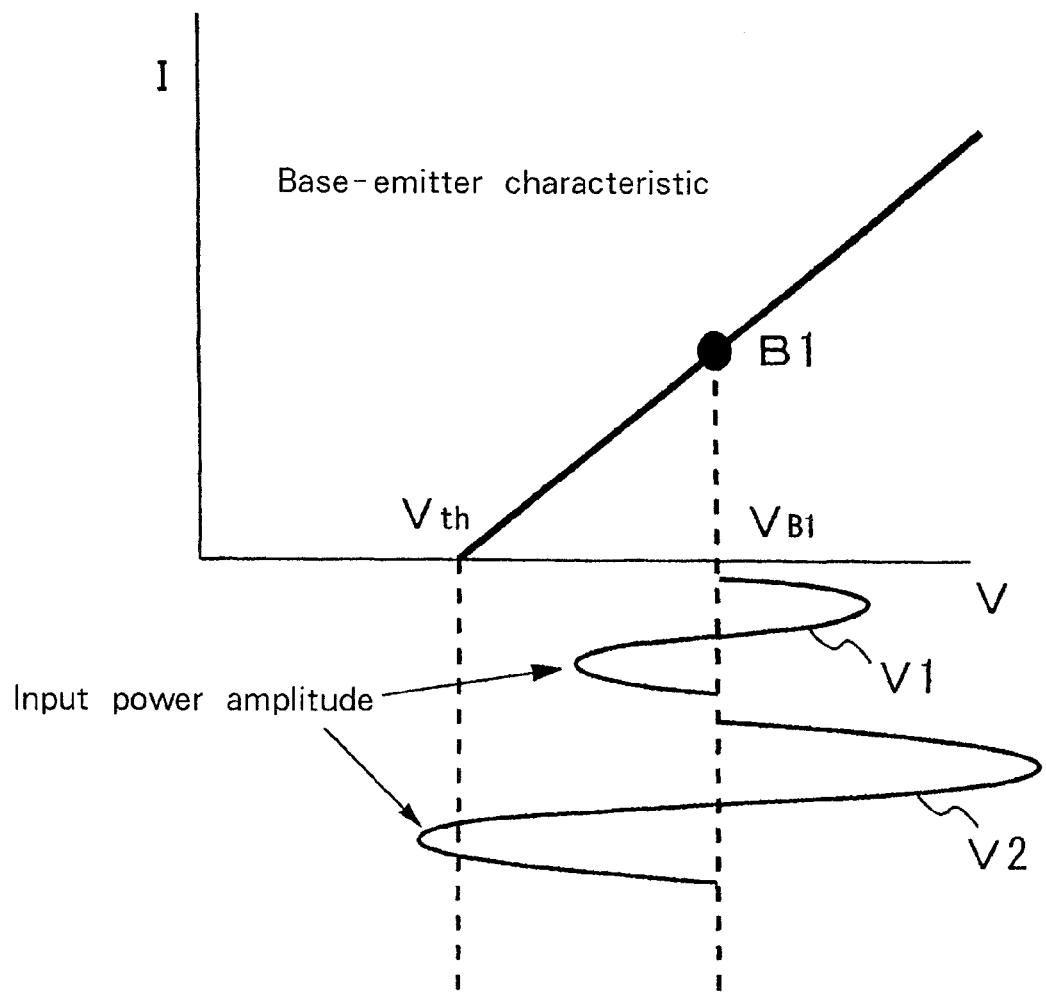
FIG. 5
A diagram for describing the first conventional amplifier.
Figure 27:
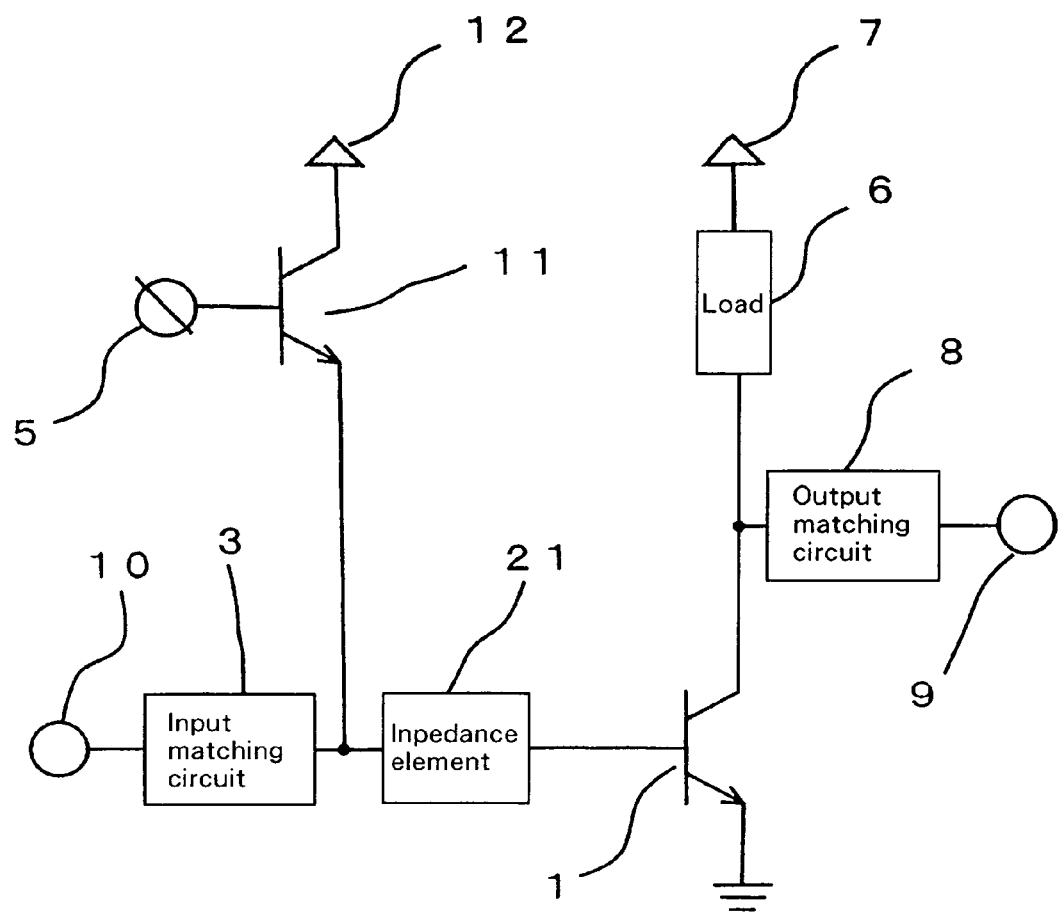
FIG. 27

FIG. 27 is a diagram illustrating an amplifier which inverts the phase of IM3 with respect to the basic wave according to a second embodiment of the present invention, and corresponds to FIG. 4 of the second conventional example. This embodiment uses the base-emitter of bias supply transistor 11 instead of diode 4 in the first embodiment. Therefore, the effect and operation are the same as those of the first embodiment. This embodiment alleviates the aforementioned second problem in which, when reference power supply 5 is implemented by a resistor, the resistor causes a voltage drop. In this embodiment, since the bias is also supplied to amplifying transistor 1 through impedance element 21, this impedance element 21 does not block any DC current. Since this embodiment is substantially identical to the aforementioned first embodiment in effect and operation, they will be jointly described below in this embodiment.

Figure 25:
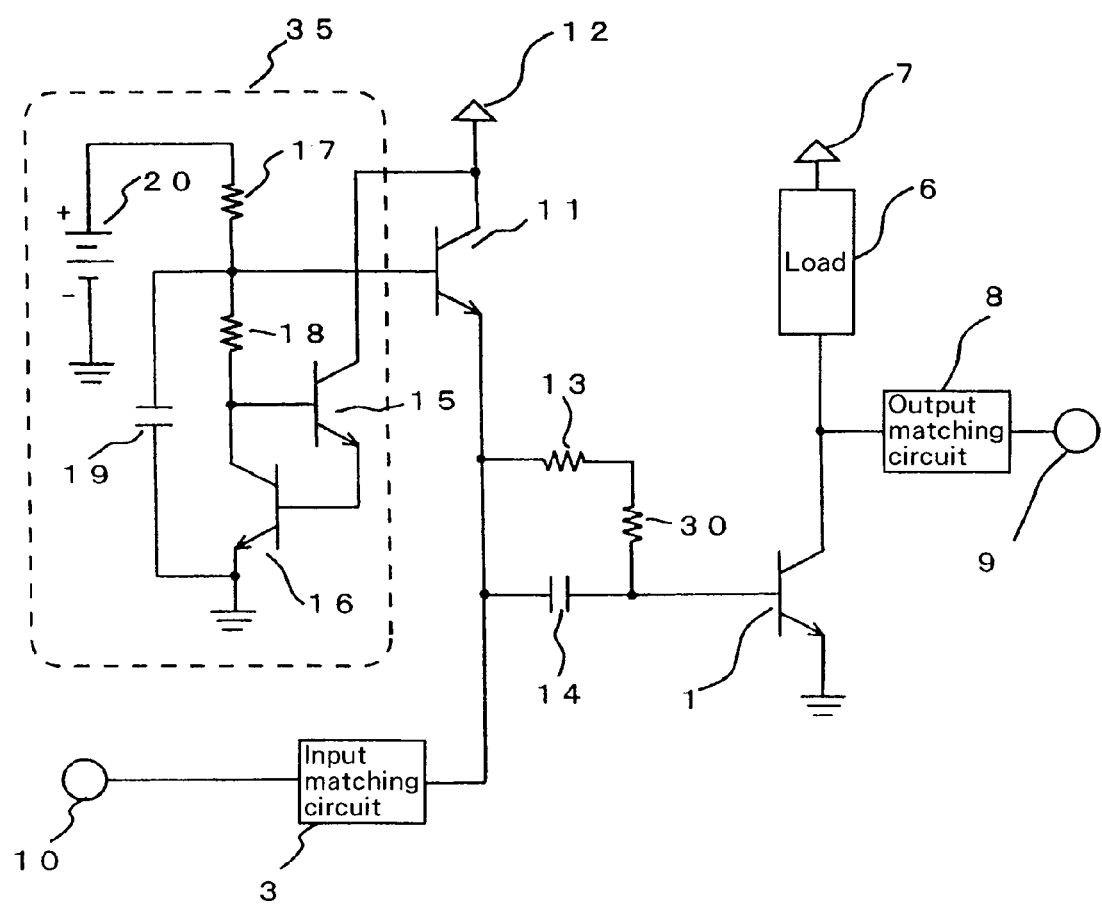
FIG. 25
A circuit diagram for describing a second embodiment of the present invention.

FIG. 25 is a diagram for describing the second embodiment of the present invention, giving a more specific example. For applying the description to the first embodiment, the base-emitter of bias supply transistor 11 is regarded as replaced with bias supply diode 4. FIG. 25 illustrates a more specific example which employs a parallel circuit of resistor 13 and capacitor capacitance 14 as impedance element 2. Also, used for reference power supply 5 was reference power supply 35 which is similar in configuration to the third conventional amplifier illustrated in FIG. 6. However, the base of bias supply transistor 11 was grounded using capacitance 19 so as to present a sufficiently low impedance in regard to high frequencies.

A GaAs hetero-junction bipolar transistor (HBT) was used for a transistor model for analysis, and five unit HBT's each having an emitter area of 120 μm² connected in parallel were used for amplifying transistor 1, resistor 13 of impedance element 2 was comprised of five 250Ω resistors connected in parallel, which also serve as a ballast resistor of transistor 1, and five 0.8-pF capacitances were connected in parallel to form capacitance 14 of impedance element 2. An HBT having an emitter area of 120 μm² was used for bias supply transistor 11. An HBT having an emitter area of 30 μm² was used for transistor 15, 16 of reference power supply 35. A 2-pF capacitance was used for capacitance 19 within reference power supply 35. A wire line having a length of one quarter wavelength with respect to the basic wave was used for load 6, and 3.5-V regulated voltage sources were used for collector power supply 7 and bias power supply 12.

Figure 26:
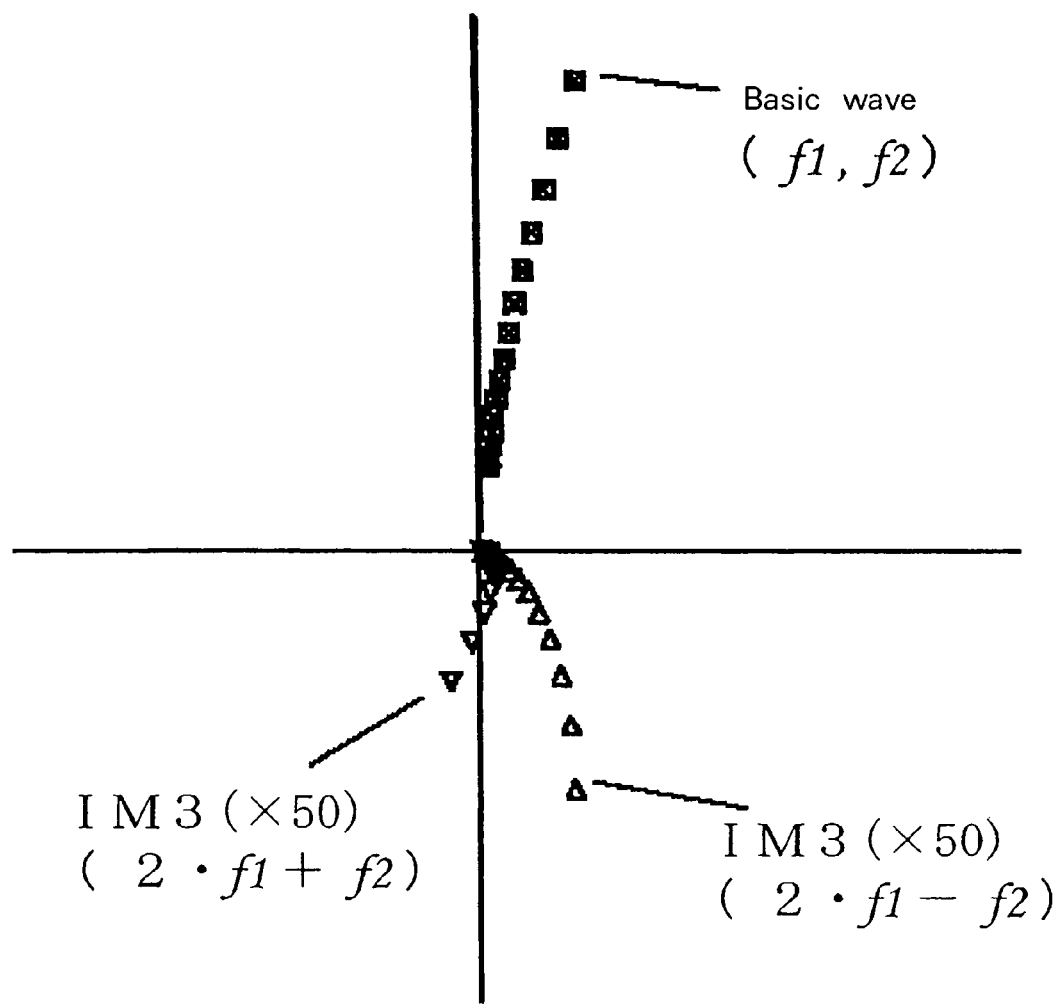
FIG. 26
A diagram for describing a phase relationship between a basic wave and distortions in the second embodiment of the present invention.

FIG. 26 shows the relationship between the basic wave and IM3 when the output power was 2 dBm, that resulted from an analysis in which the circuit parameters of reference power supply 35 and control power supply 20 were set such that the collector current of amplifying transistor 1 was 5 mA when no input signal was applied from input terminal 10, and in which two waves, f1=1948 (MHz) and f2=1952 (MHz) were applied as the basic wave. Here, the magnitude of IM3 is enlarged by a factor of 50 for purposes of illustration. IM3 is in opposite phase to the basic wave.

Under completely the same conditions, either of 1: when a wire which directly connects the emitter of bias supply transistor 11 to capacitor 14 within impedance element 2, is disconnected, 2: when impedance element 2 is removed, the emitter of bias supply transistor 11 is directly connected to the base of amplifying transistor 1, and a ballast resistor of 2.2Ω (≈250/βΩ) is employed and connected to the emitter side; and 3: when capacitor 19 within reference power supply 35 is removed, in the circuit diagram of FIG. 25, an emitter output impedance of bias supply transistor 11 becomes higher with respect to a base input impedance of amplifying transistor 1, as viewed from input terminal 10 (outlet of input matching circuit 3) for high frequencies, so that IM3 is in phase with the basic wave when the output power is 2 dBm.

Figure 28:
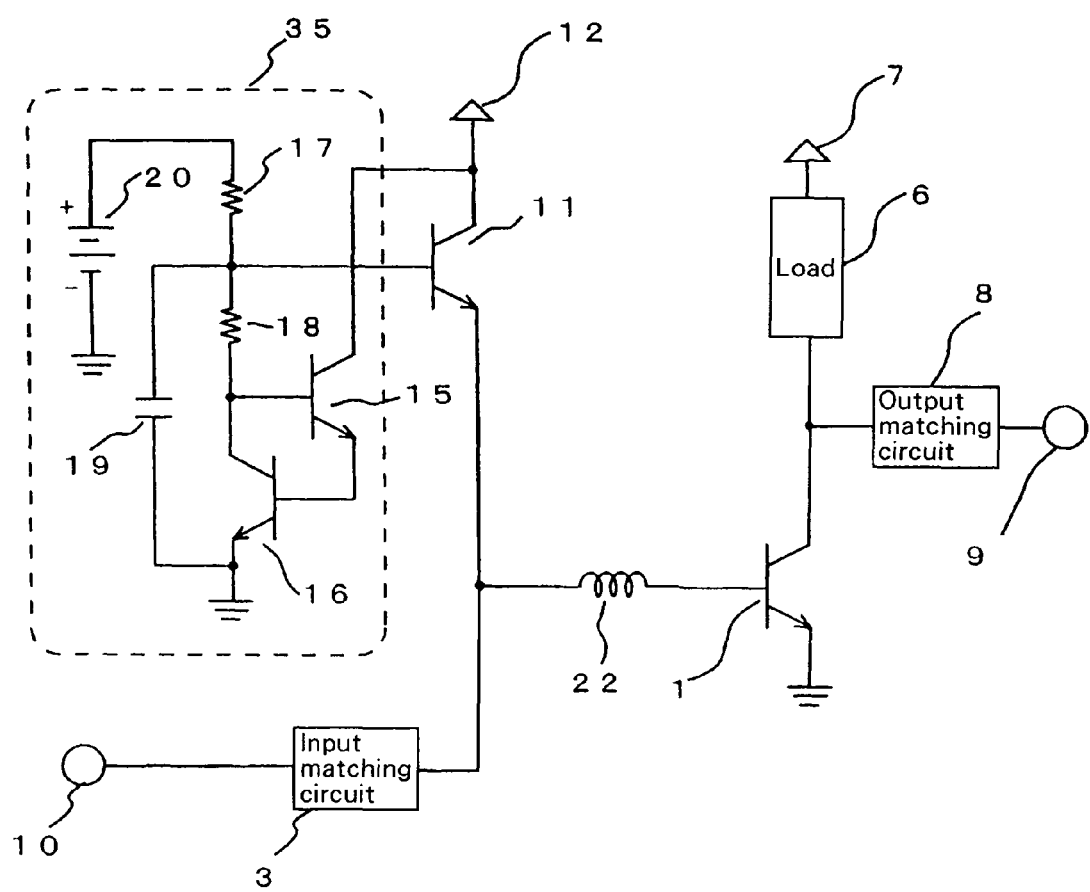
Figure 29:
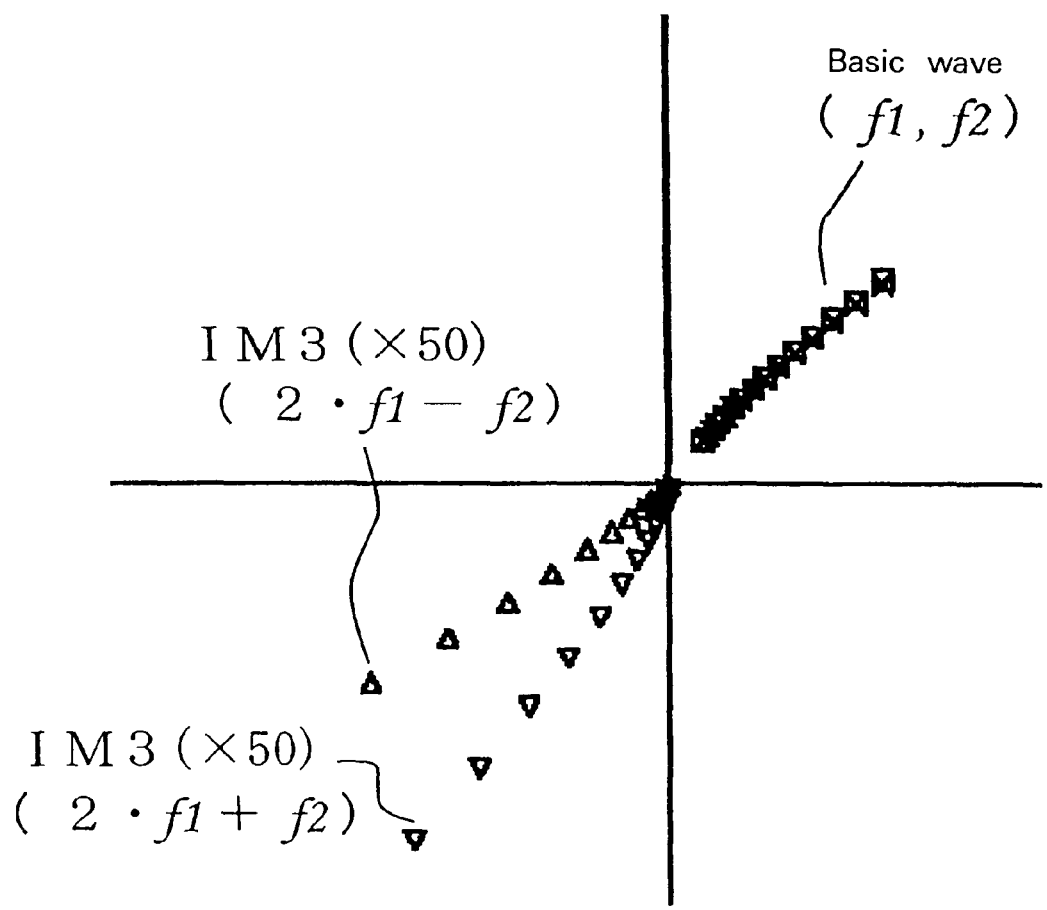

FIG. 28 is a diagram illustrating another example for more specifically describing the second embodiment of the present invention, where inductor 22 is used for impedance element 21. Likewise, for applying the description to the first embodiment, the base-emitter of bias supply transistor 11 is also regarded herein as replaced with bias supply diode 4. FIG. 29 shows the relationship between the basic wave and IM3 when the output power is 2 dBm, that results from an analysis that was made under the same conditions as the first embodiment except that 50-nH inductor 22 was used for impedance element 21, and a ballast resistor of 2.2Ω (≈250/βΩ) was employed and connected in parallel on the emitter side. Here, the magnitude of IM3 is enlarged by a factor of 50 for purposes of illustration. IM3 is in opposite phase to the basic wave.

Here, in comparing the ratio of the magnitude of IM3 to the magnitude of the basic wave in this embodiment illustrated in FIG. 29 with the ratio of the magnitude of IM3 to the magnitude of the basic wave in the conventional example illustrated in FIG. 23, this embodiment provides a larger proportion of the magnitude of IM3 to the basic wave. This means that the present invention provides a technique for reducing distortions in a multi-stage amplifier but this is not necessarily a technique for reducing distortions in a single-stage amplifier.

Under completely the same conditions as this embodiment, either of 1: when inductor 22, which is an impedance element, is removed, and 2: the capacitance within reference power supply 25 is removed, in the circuit diagram of FIG. 28, an emitter output impedance of bias supply transistor 11 becomes higher with respect to a base input impedance of amplifying transistor 1, as viewed from input terminal 10 (outlet of input matching circuit 3) for high frequencies, so that IM3 is in phase with the basic wave when the output power is 2 dBm.

Third Embodiment

Figure 30:
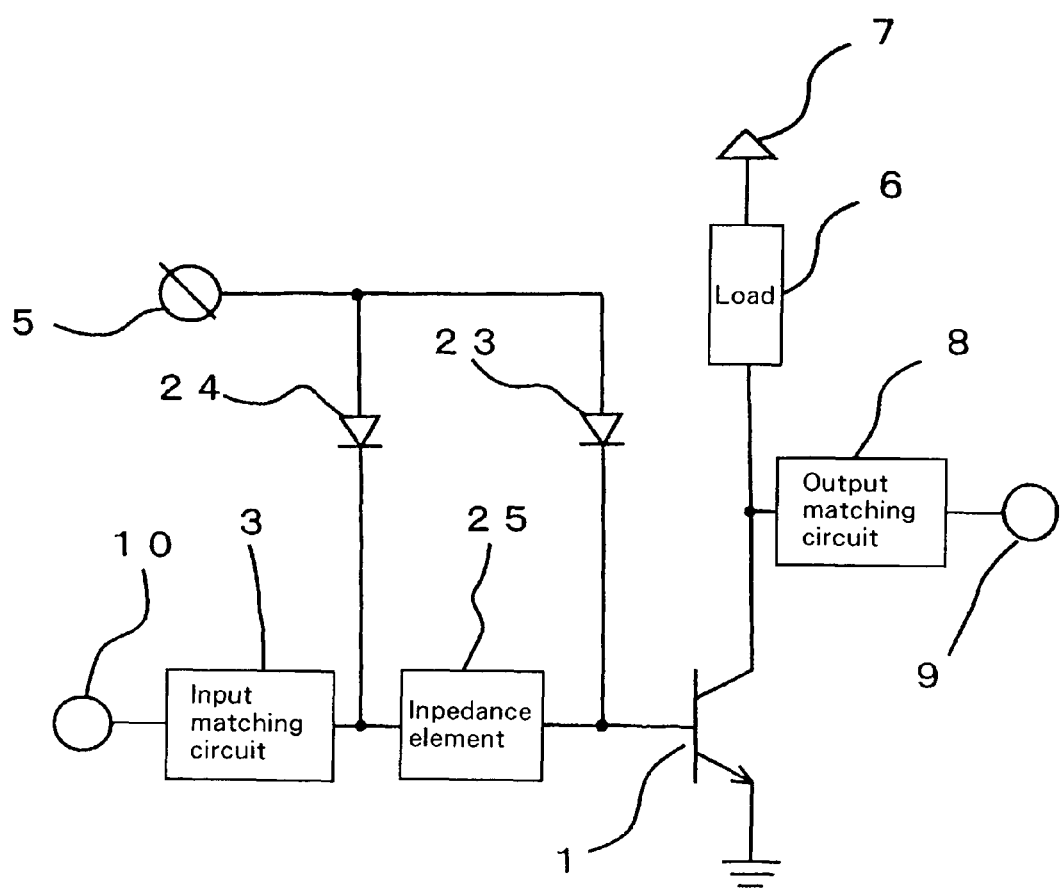

FIG. 30 is a diagram illustrating an amplifier which inverts the phase of IM3 with respect to the basic wave according to a third embodiment of the present invention. Amplifying transistor 1 forms an emitter grounded amplifier circuit, where the base of transistor 1 is biased by bias supply diode 23. Also, the same transistor 1 has a base connected to input matching circuit 3 and bias supply diode 24 through impedance element 25. Anodes of Bias supply diodes 23 and 24 have their anodes connected to reference power supply 5. Transistor 1 has a collector which is connected to collector power supply 7 through load 6 and which is also connected to output terminal 9 through output matching circuit 8.

Since this embodiment is identical in effect and operation to a fourth to a sixth embodiment, later described, they will be jointly described in the sixth embodiment.

Fourth Embodiment

Figure 31:
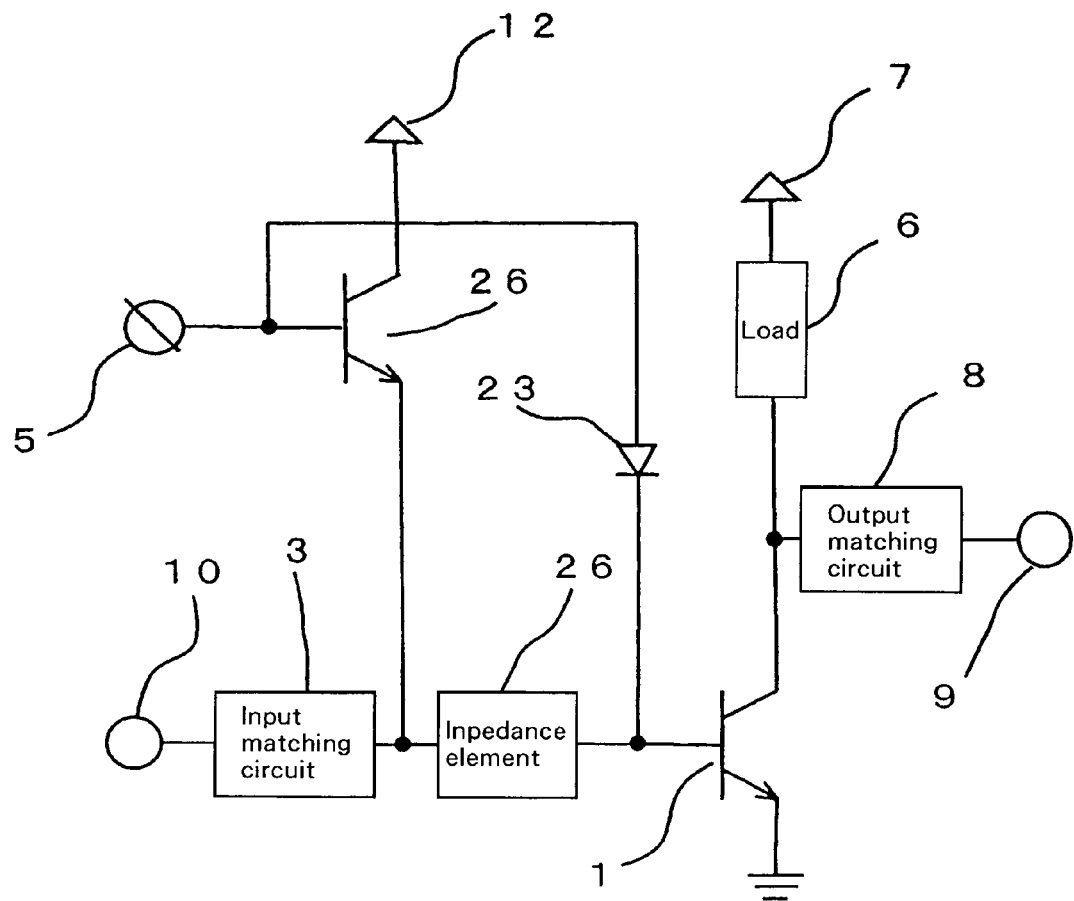

FIG. 31 is a diagram illustrating an amplifier which inverts the phase of IM3 with respect to the basic wave according to a fourth embodiment of the present invention. This embodiment uses the base-emitter of bipolar transistor 26 instead of diode 24 in the third embodiment. Accordingly, since the fourth embodiment is identical in effect and operation to the third embodiment as well as to a fifth to a sixth embodiment, later described, they will be jointly described in the sixth embodiment.

Fifth Embodiment

Figure 32:
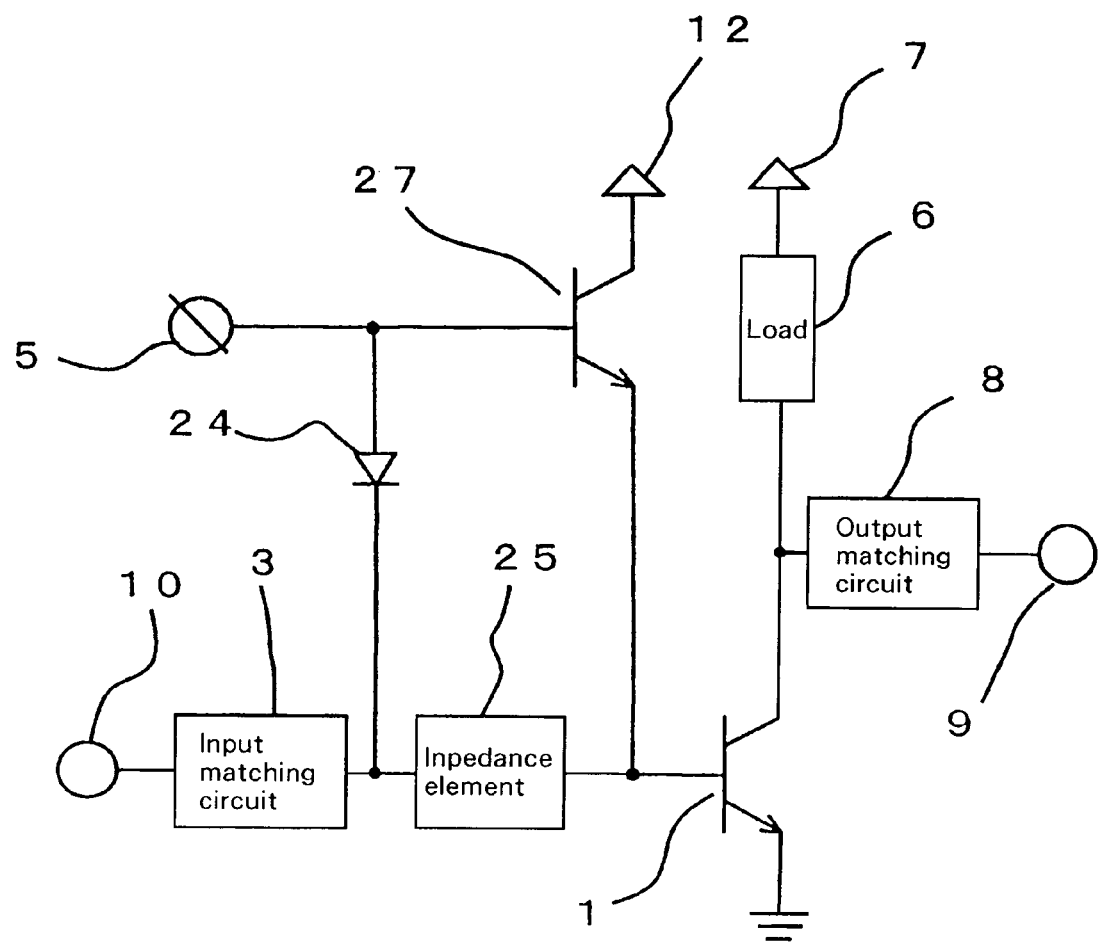

FIG. 32 is a diagram illustrating an amplifier which inverts the phase of IM3 with respect to the basic wave according to the fifth embodiment of the present invention. This embodiment uses the base-emitter of bipolar transistor 27 for diode 23 of the third embodiment. Accordingly, since the fifth embodiment is identical in effect and operation to the third embodiment, fourth embodiment, and sixth embodiment, later described, they will be jointly described in the sixth embodiment.

Sixth Embodiment

Figure 33:
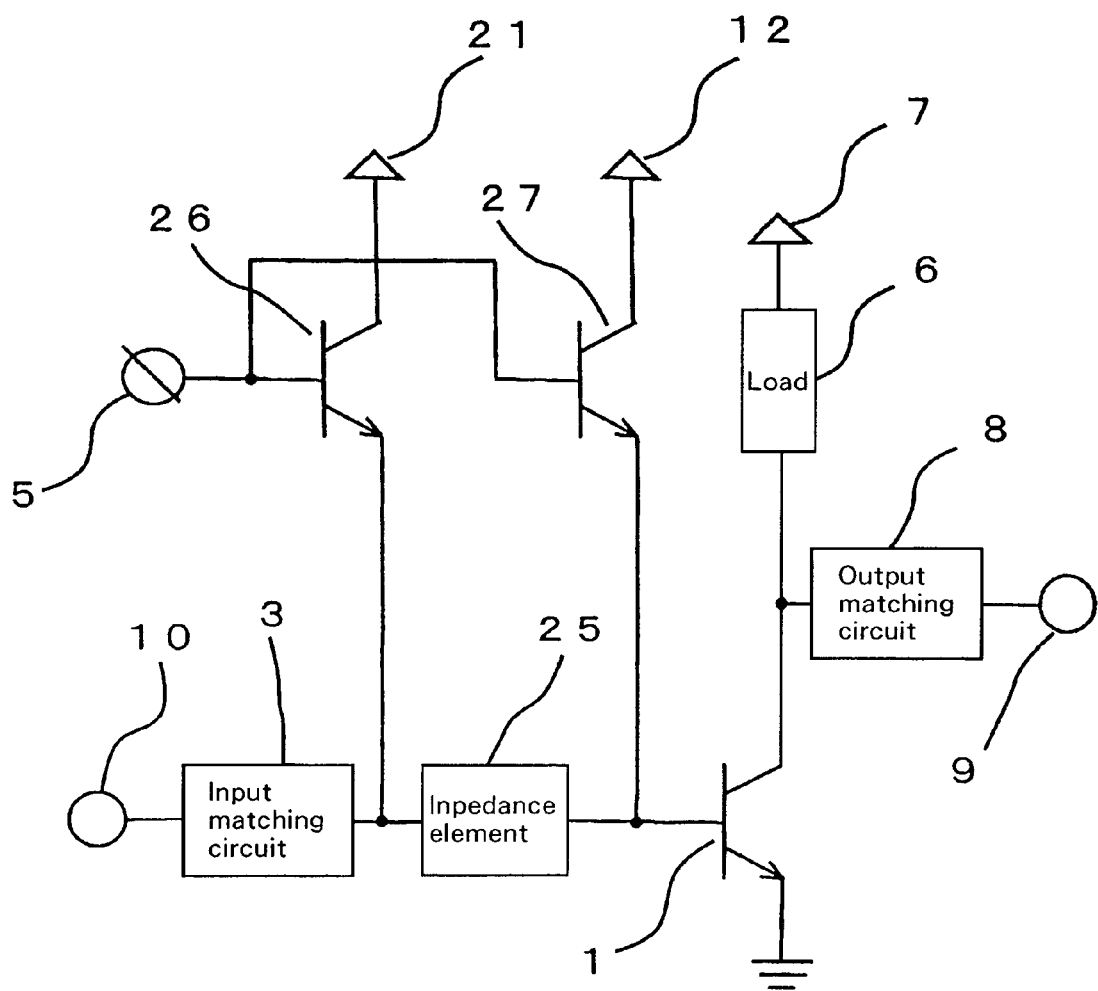

FIG. 33 is a diagram illustrating an amplifier which inverts the phase of IM3 with respect to the basic wave according to the sixth embodiment of the present invention. This embodiment uses the base-emitter of bias supply transistors 26, 27 for diodes 23, 24 in the third embodiment. Accordingly, the sixth embodiment is identical to the third to fifth embodiments in effect and operation.

In regard to the operation of the third to sixth embodiments, the phase of IM3 is inverted with respect to the basic wave for reasons substantially identical to the first to second embodiments. Since this embodiment is identical to the third to fifth embodiments in effect and operation, the sixth embodiment will be given as an example to describe them together.

Figure 6:
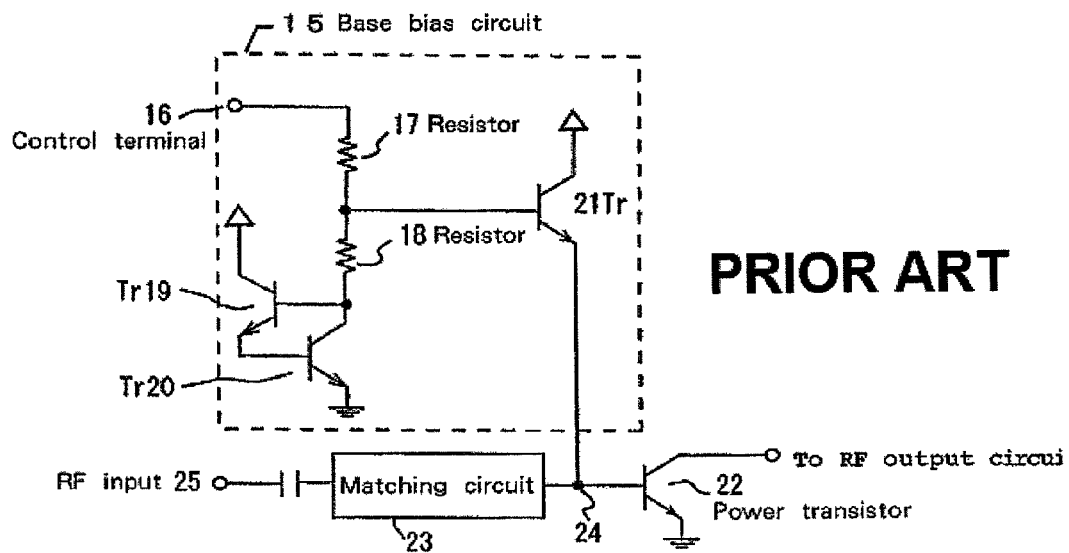
FIG. 6
A circuit diagram for describing a third conventional amplifier.
Figure 7:
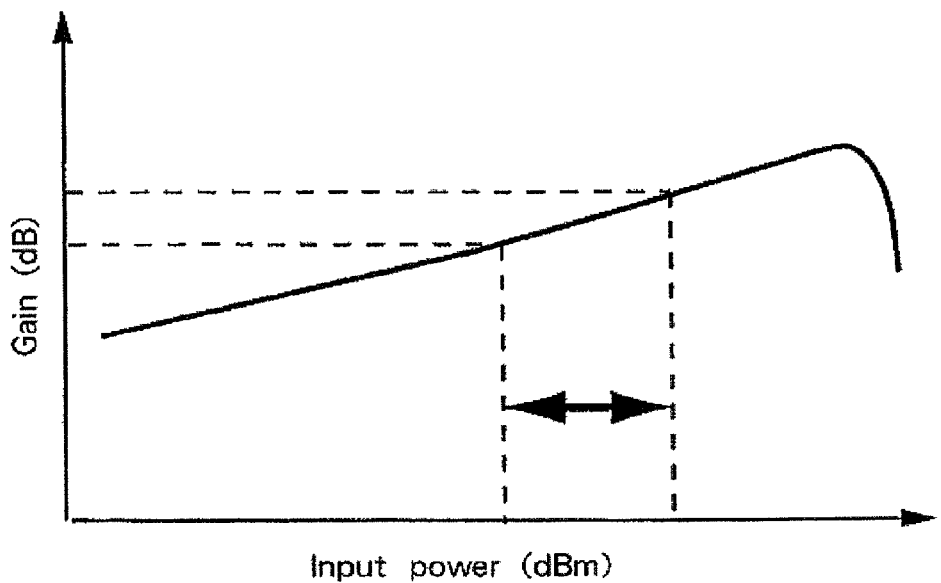
FIG. 7
A circuit diagram for describing a gain expansion characteristic.
Figure 8:
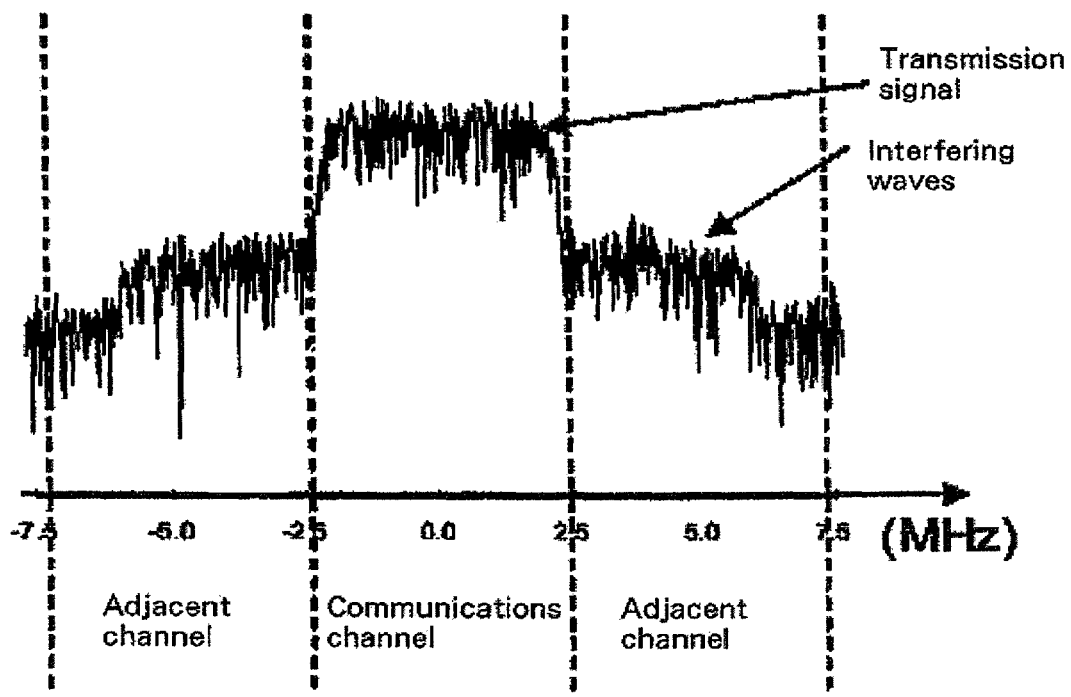
FIG. 8
A diagram for describing an adjacent channel power ratio (ACPR).
Figure 9:
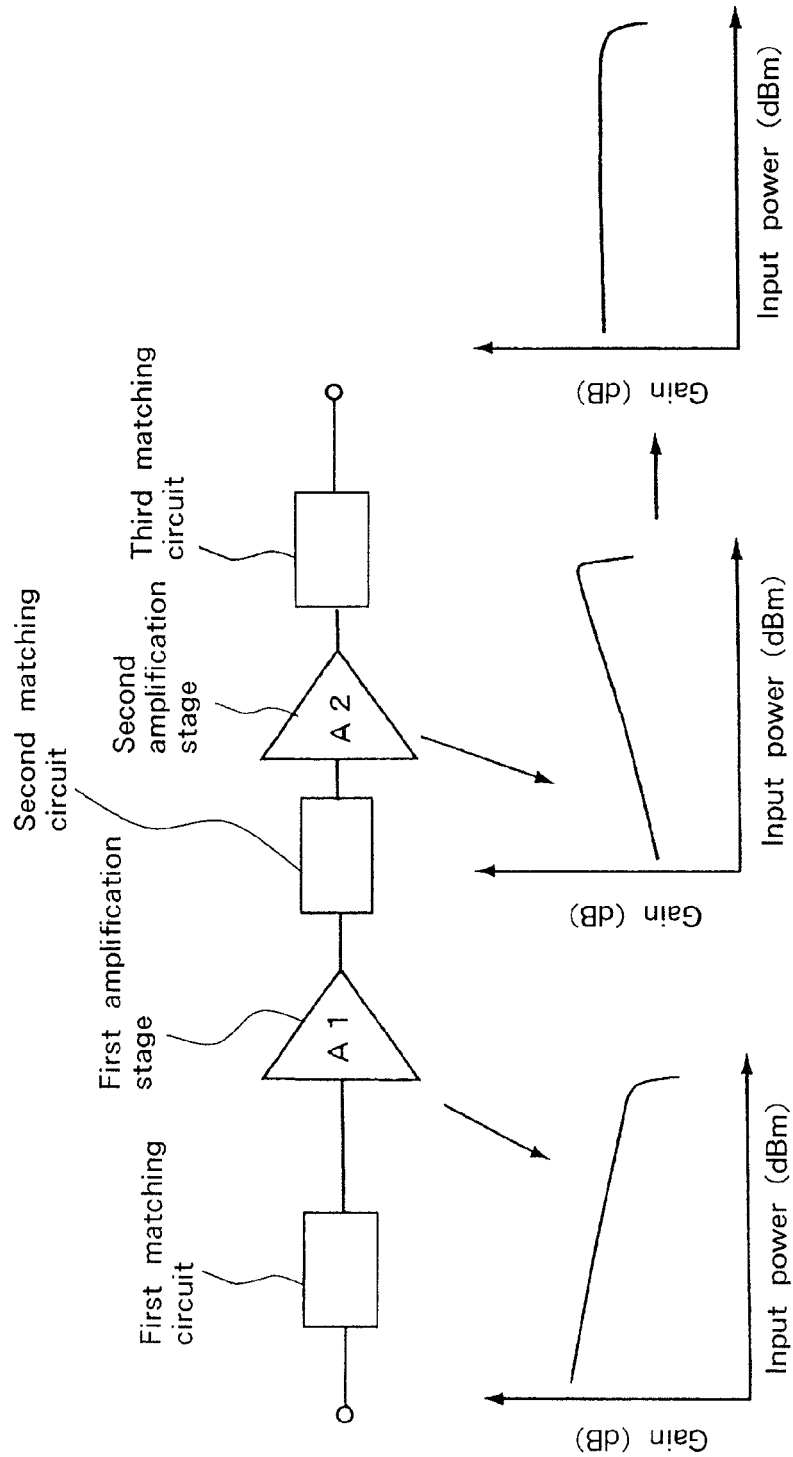
FIG. 9
A diagram for describing a fourth conventional amplifier.
Figure 10:
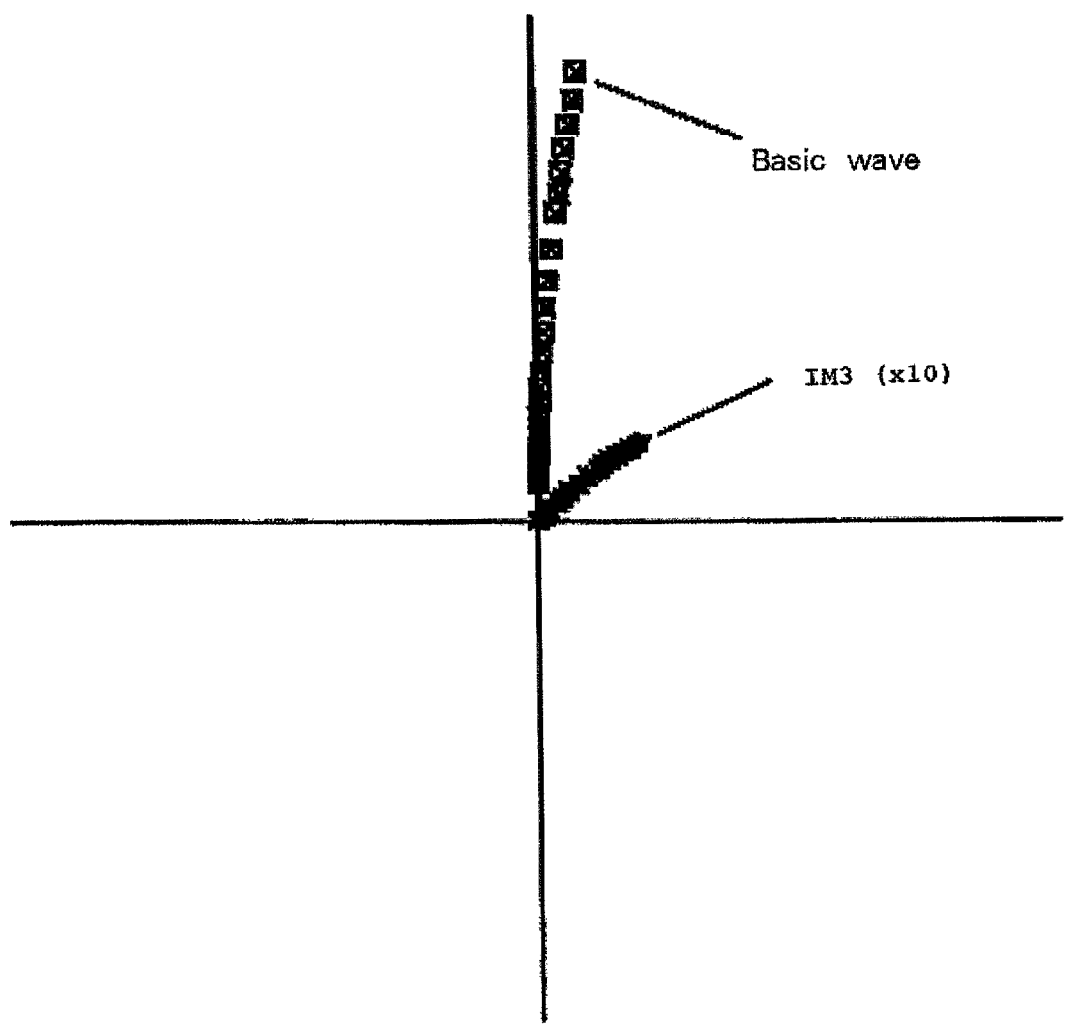
FIG. 10
A phase relationship between a basic wave and an IM3 signal is shown when the third conventional amplifier is biased to AB-class close to B-class.
Figure 11:
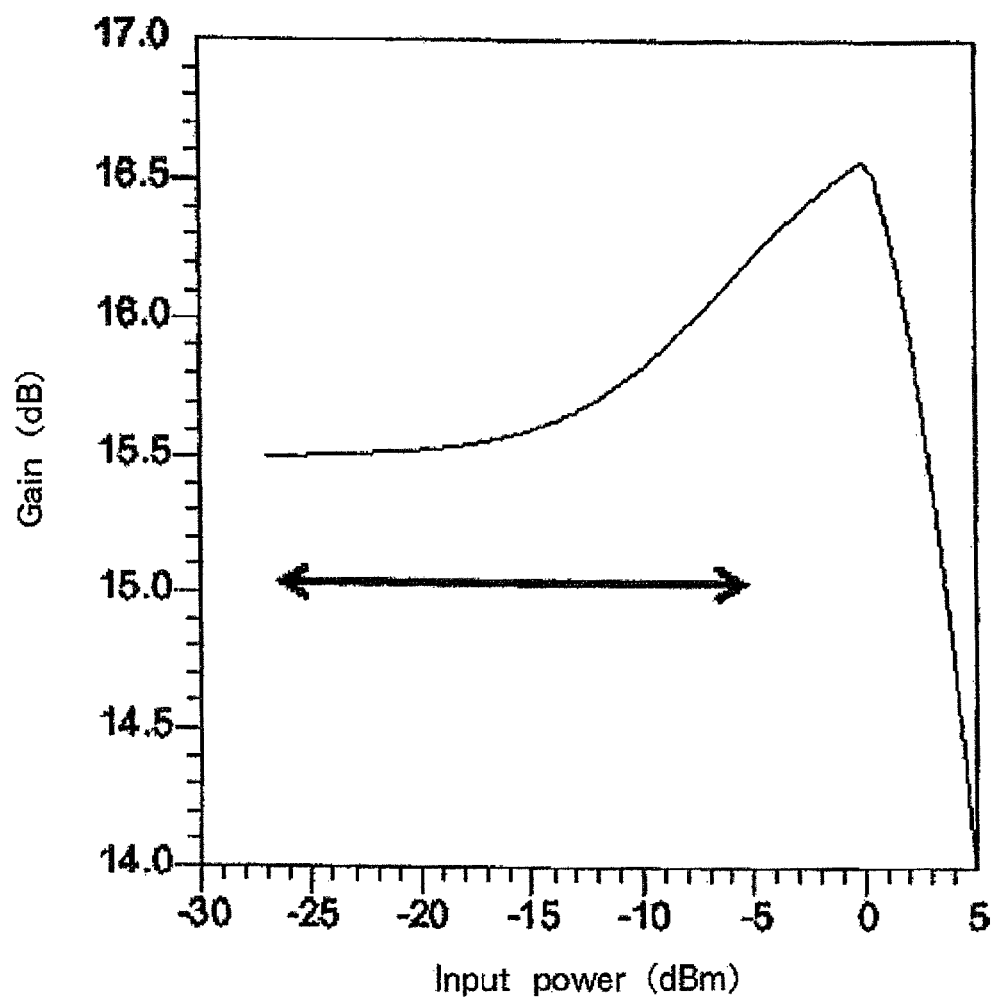
FIG. 11
A diagram for describing the relationship between input power and gain when the third conventional amplifier is biased to AB-class close to B-class.
Figure 12:
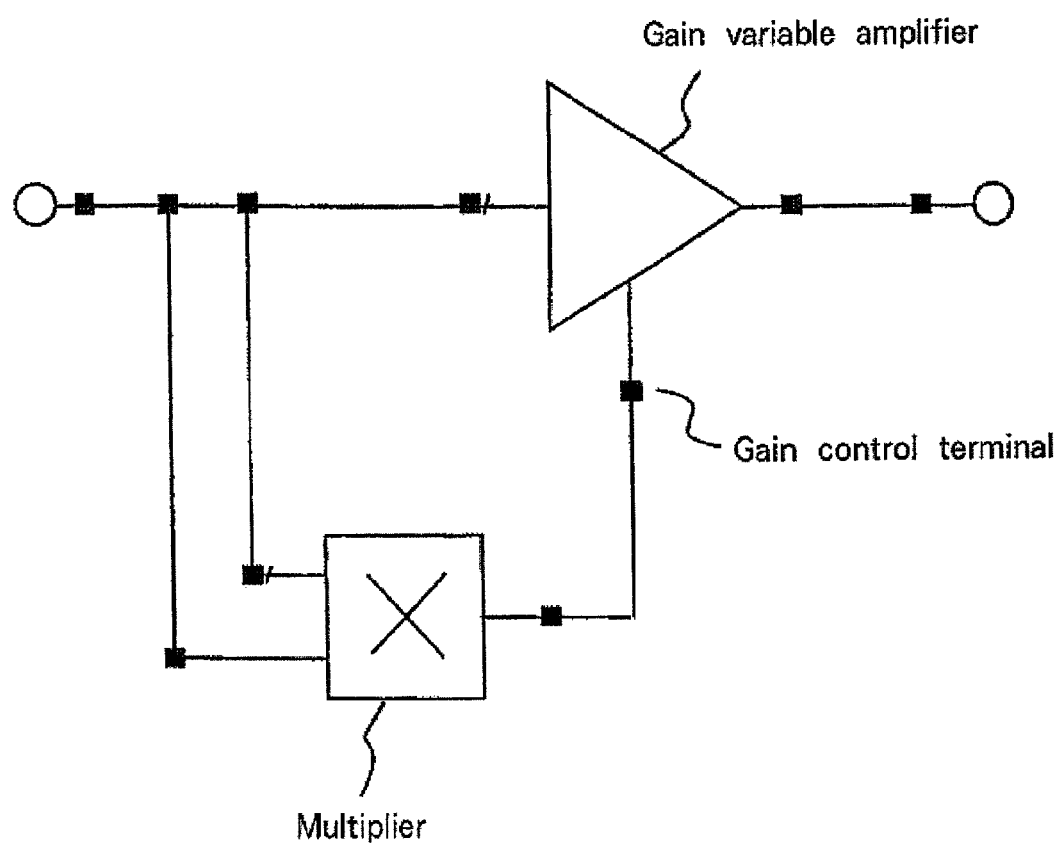
FIG. 12
A circuit diagram for describing a gain expansion amplifier.
Figure 13:
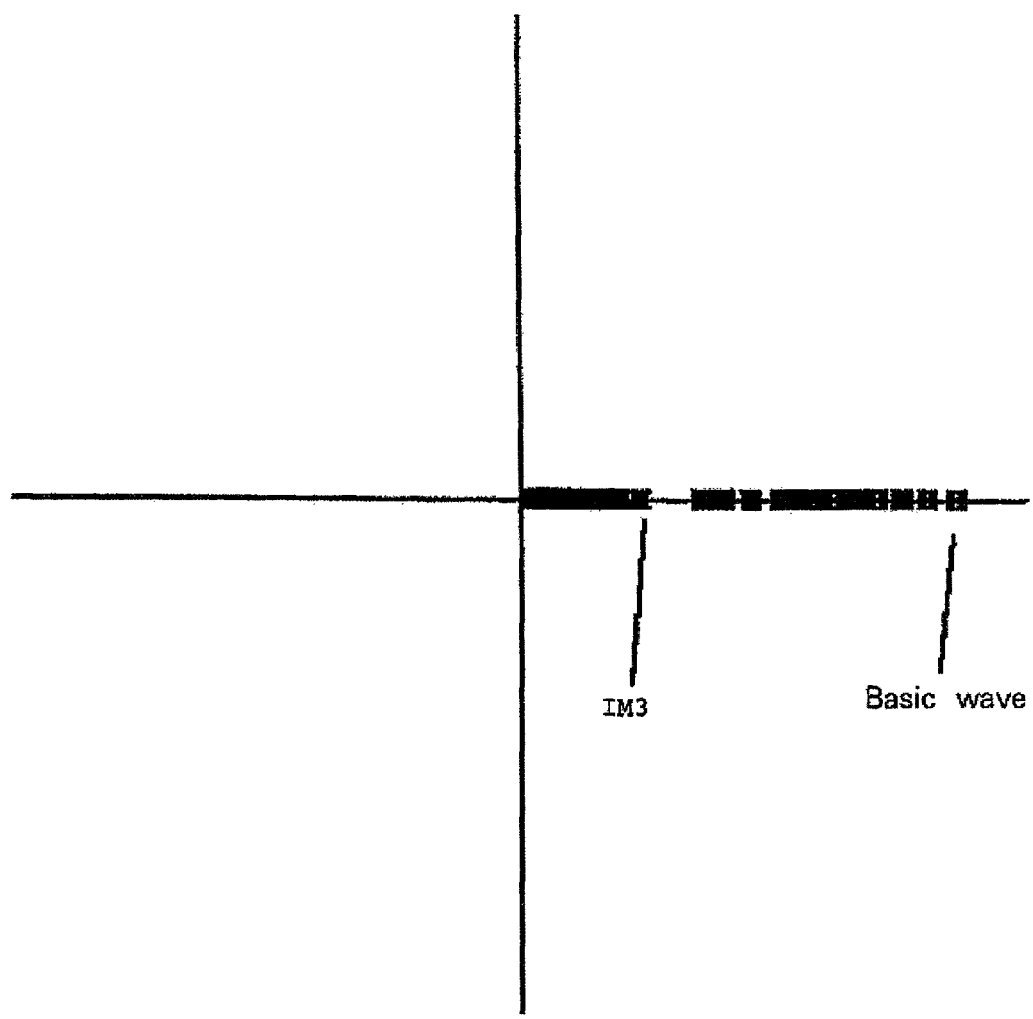
FIG. 13
A diagram for describing a phase relationship between a basic wave and distortions in a general gain expansion amplifier.
Figure 14:
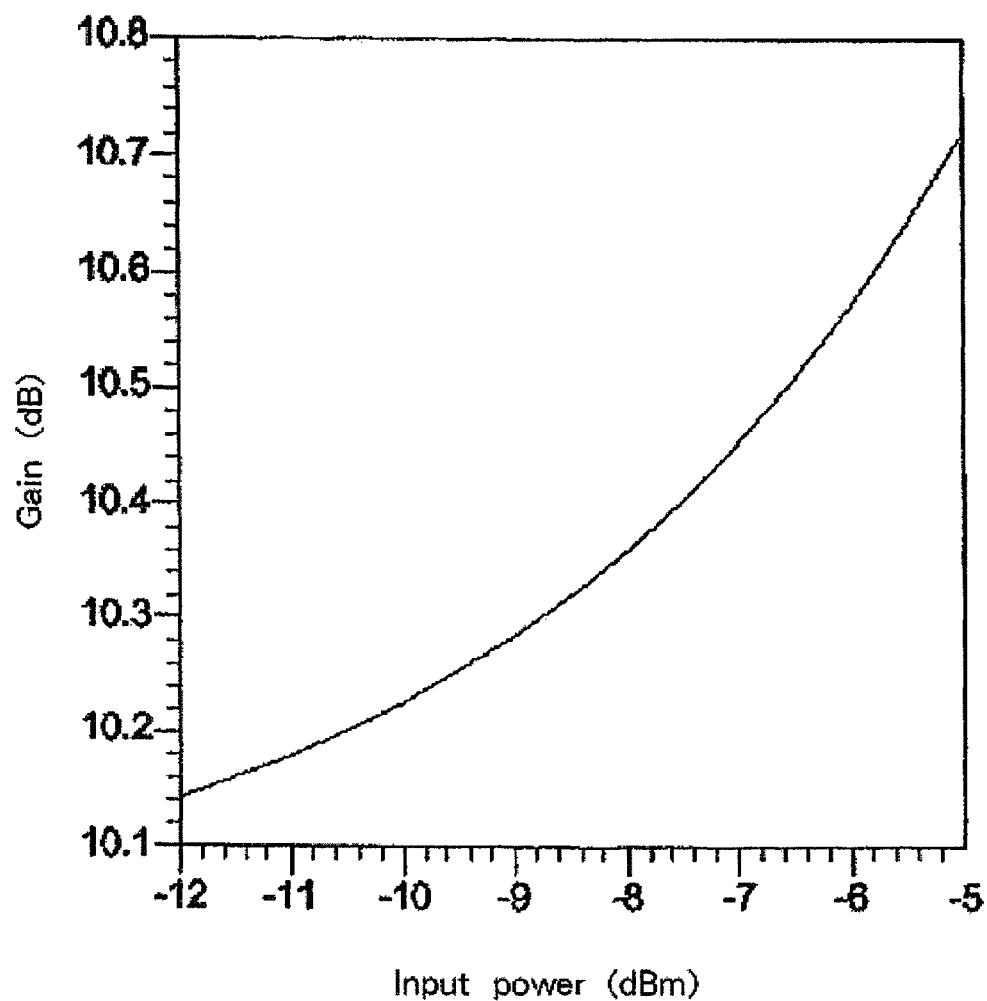
FIG. 14
A diagram for describing the relationship between input power and gain when a gain expansion amplifier is created using the circuit of FIG. 12.
Figure 15:
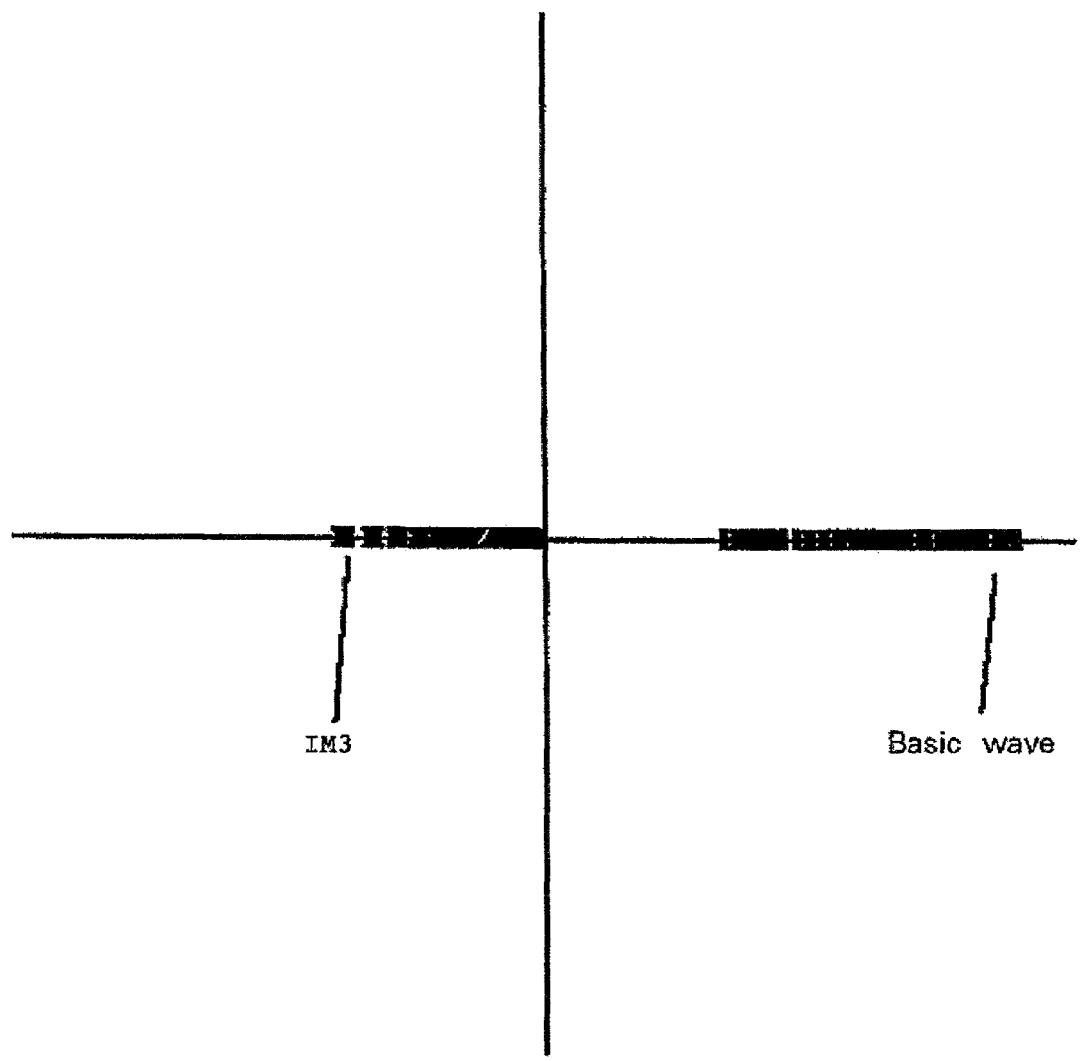
FIG. 15
A diagram for describing a phase relationship between a basic wave and distortions in a general gain compression amplifier.
Figure 16:
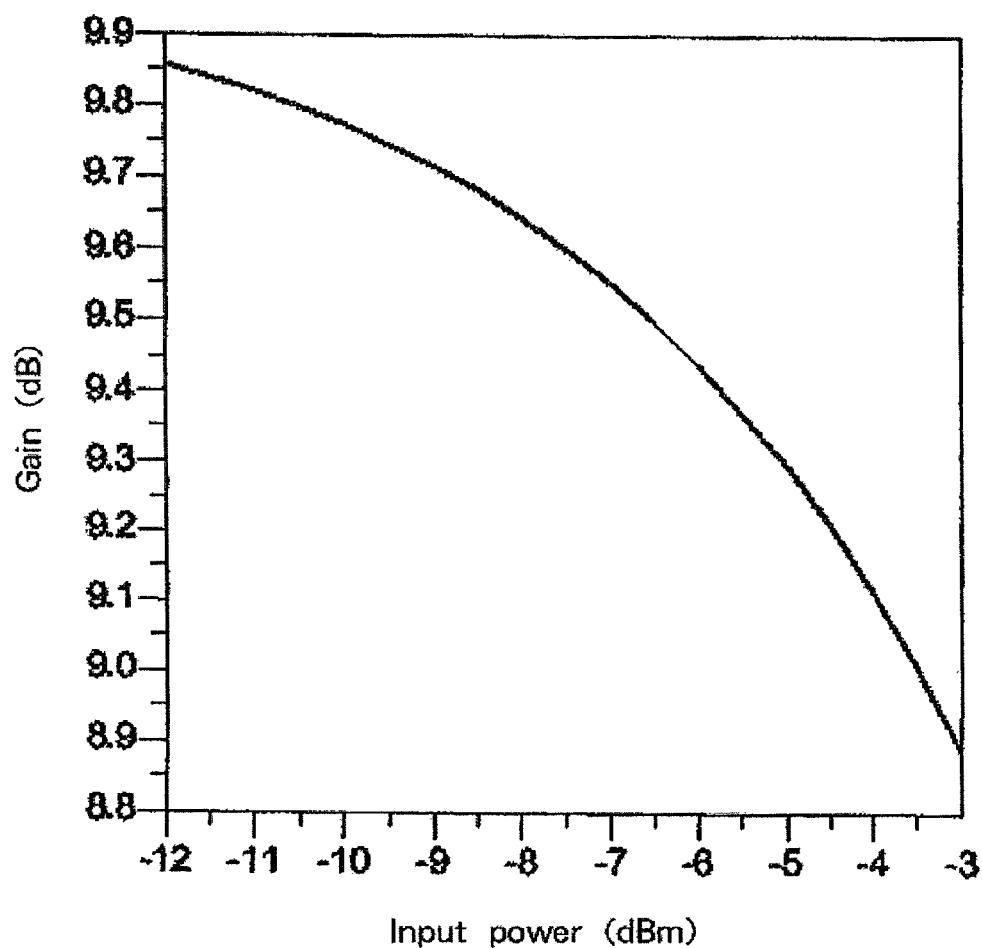
FIG. 16
A diagram for describing the relationship between input power and gain when a gain compression amplifier is created using the circuit of FIG. 12.
Figure 17:
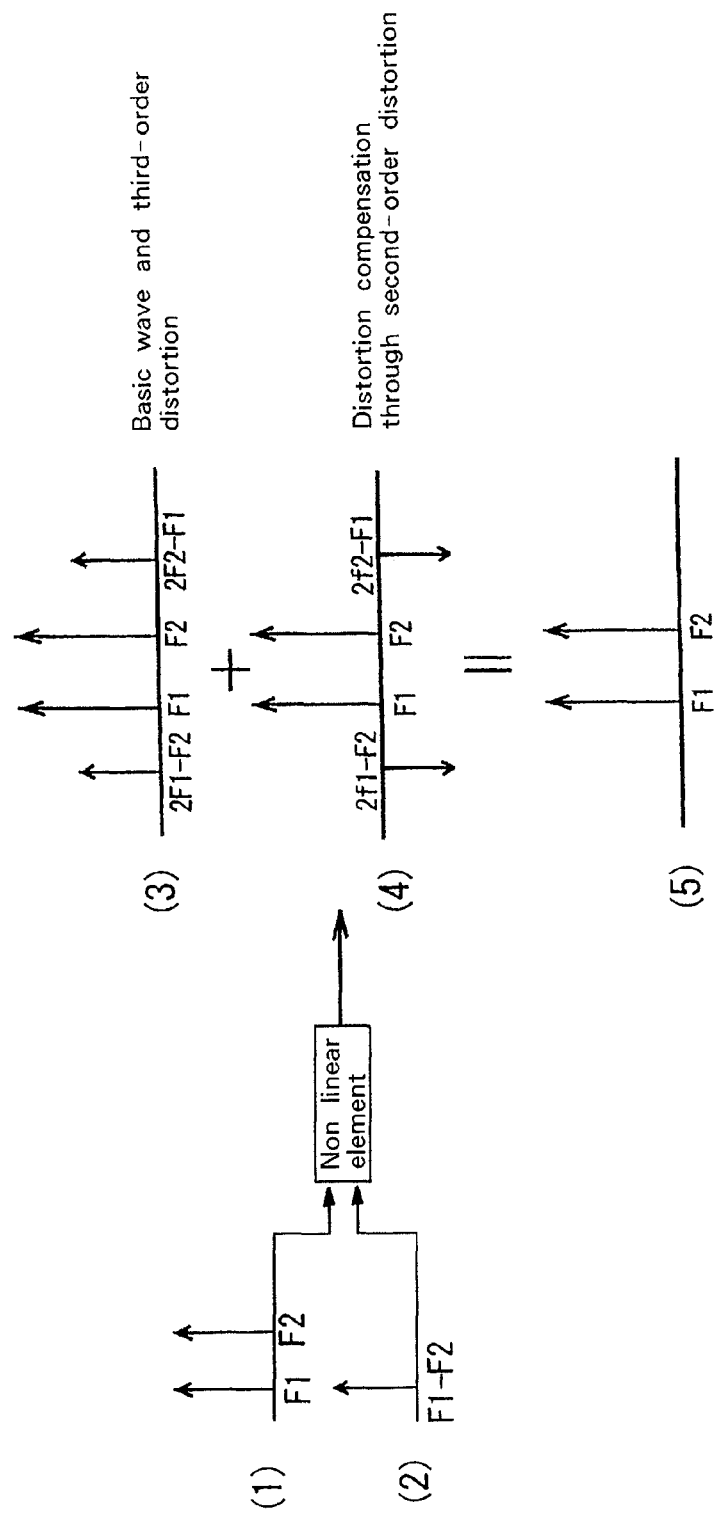
FIG. 17
A diagram for describing a fifth conventional amplifier.
Figure 34:
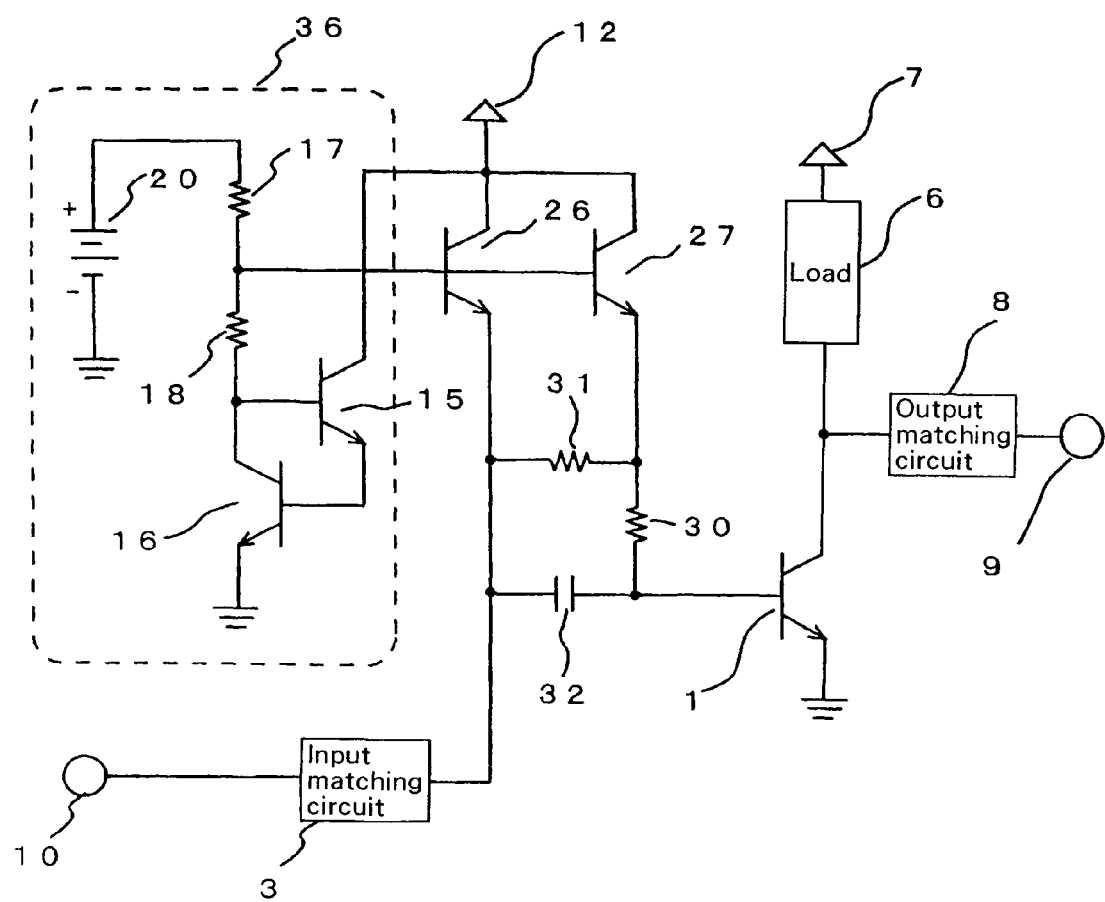

FIG. 34 is a diagram for describing the sixth embodiment of the present invention. In FIG. 34, impedance element 25 in FIG. 33 comprises a parallel circuit of a serial circuit of resistor 30 and resistor 31 with capacitance 32. Also, reference power supply 36 identical in configuration to the third conventional amplifier illustrated in FIG. 6 is used for reference power supply 5.

A GaAs hetero-junction bipolar transistor (HBT) was used for a transistor model for analysis, and five unit HBT's, each having an emitter area of 120 $\mu m^2$ and connected in parallel, was used for amplifying transistor 1, resistor 30 of impedance element 25 was comprised of five 250Ω resistors connected in parallel, which also served as a ballast resistor of transistor 1, and a 1-kΩ resistor was used for resistor 31. An HBT having an emitter area of 120 $\mu m^2$ was used for bias supply transistor 27. Also, an HBT having an emitter area of 30 $\mu m^2$ was used for bias supply transistor 26. Transistors 15, 16 of reference power supply 36 that have an emitter area of 30 $\mu m^2$ were used. A wire line having a length of one quarter wavelength with respect to the basic wave was used for load 6, and 3.5-V regulated voltage sources were used for collector power supply 7 and bias power supply 12.

Figure 35:
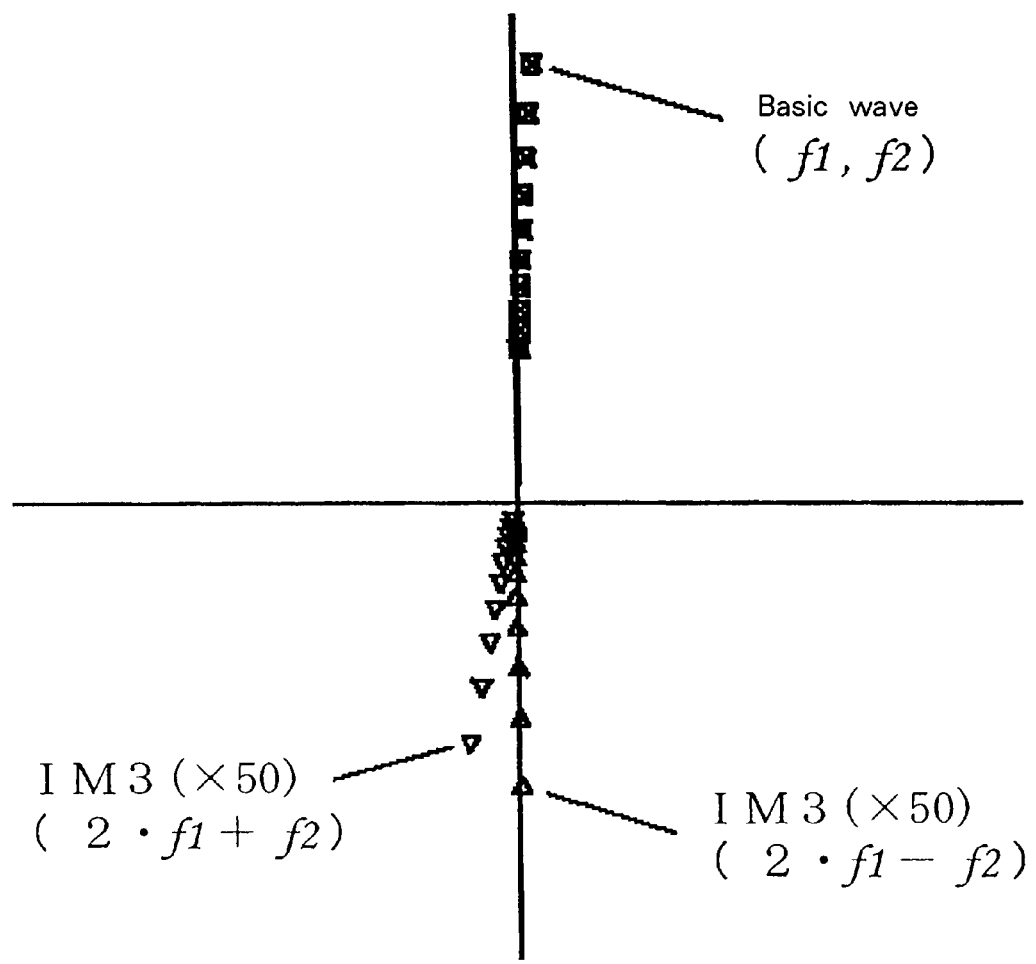

FIG. 35 shows the relationship between the basic wave and IM3 when the output power was 2 dBm, that resulted from an analysis in which the circuit parameters of reference power supply 36 and control power supply 20 were set such that the collector current of amplifying transistor 1 was 5 mA when no input signal was applied from input terminal 10, and two waves, f1=1948 (MHz) and f2=1952 (MHz) were applied as the basic wave. Here, the magnitude of IM3 is enlarged by a factor of 50 for purposes of illustration. IM3 is in opposite phase to the basic wave.

Figure 36:
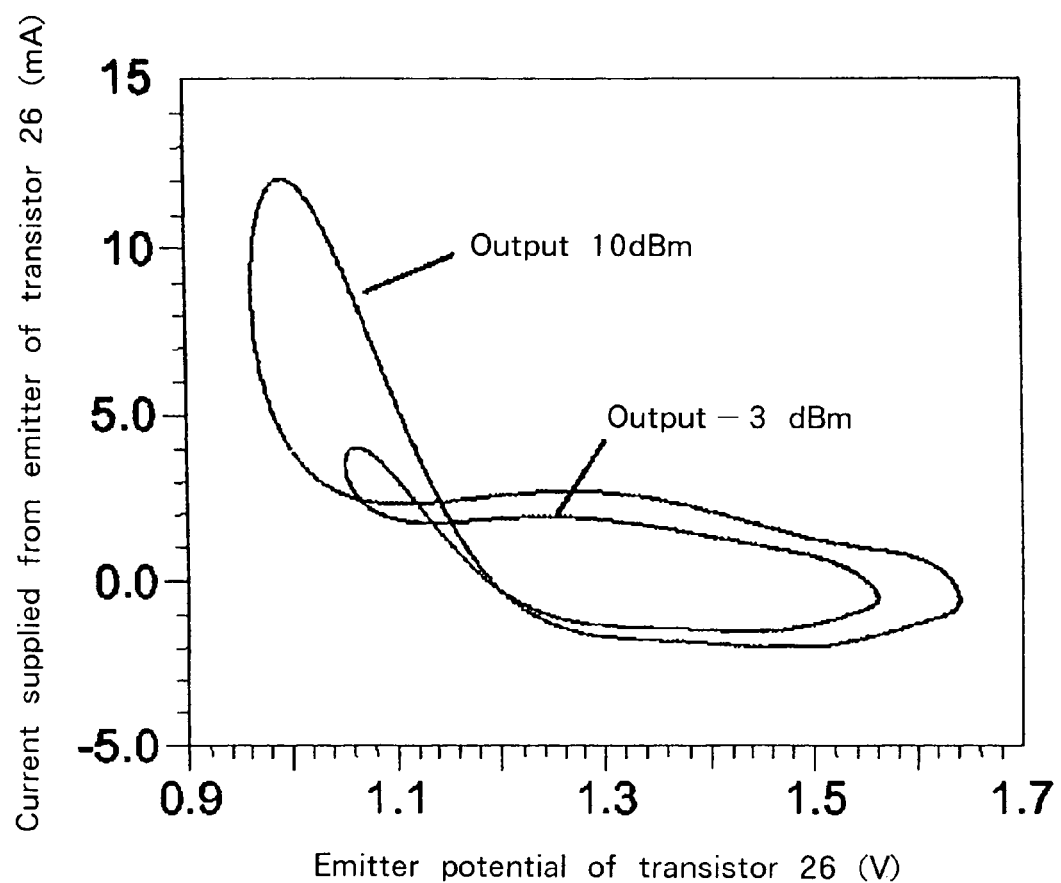

FIG. 36 shows the relationship between an instantaneous value of an emitter potential of transistor 26 and a current supplied from the emitter of the same transistor 26. This diagram shows load lines, which represent an internal impedance of transistor 26. Two lines shown in the figure represent load lines near a maximum amplitude (at the moment at which two frequencies are just added to each other) when two frequencies are supplied to provide 10 dBm and −3 dBm output. As can be seen from the figure, it is understood that as compared with a small amplitude, when a large amplitude is supplied, the output impedance of transistor 26 is extremely small when the base potential is reduced.

The sixth embodiment is identical to the first to second embodiments in that the change in impedance compresses the instantaneous value of the amplitude applied to amplifying transistor 1, and the basic wave at the output is in opposite phase to IM3. Advantages provided by employing the third to sixth embodiments are as follows. In the first to second embodiments, the impedance element comprises a circuit having a real part of impedance such as the parallel circuit of a resistor and a capacitor, so that when input matching is performed, energy is consumed by the real part of impedance to cause a loss. Also, since the resistor supplies a bias current to amplifying transistor 1, the value cannot be unreasonably increased. With the employment of the third to sixth embodiments, a bias current can be supplied to amplifying transistor 1 by bias supply transistor 27, so that the value of resistor 31 can be increased to prevent high frequencies from passing through the resistor side.

Also, while this embodiment does not particularly employ a technique for reducing the impedance of the reference power supply in regard to high frequencies, similar effects can also be obtained when the bases of bias supply transistors 26 and 27 are grounded using capacitances.

Seventh Embodiment

Figure 37:
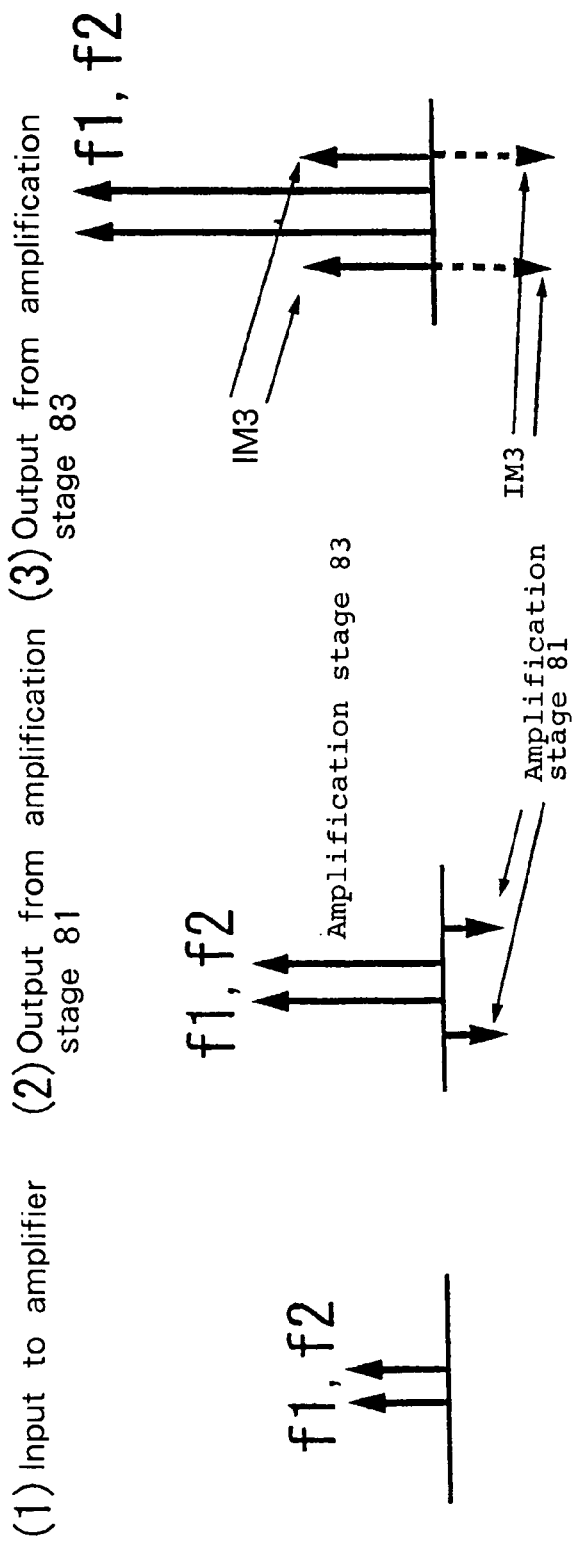
Figure 38:
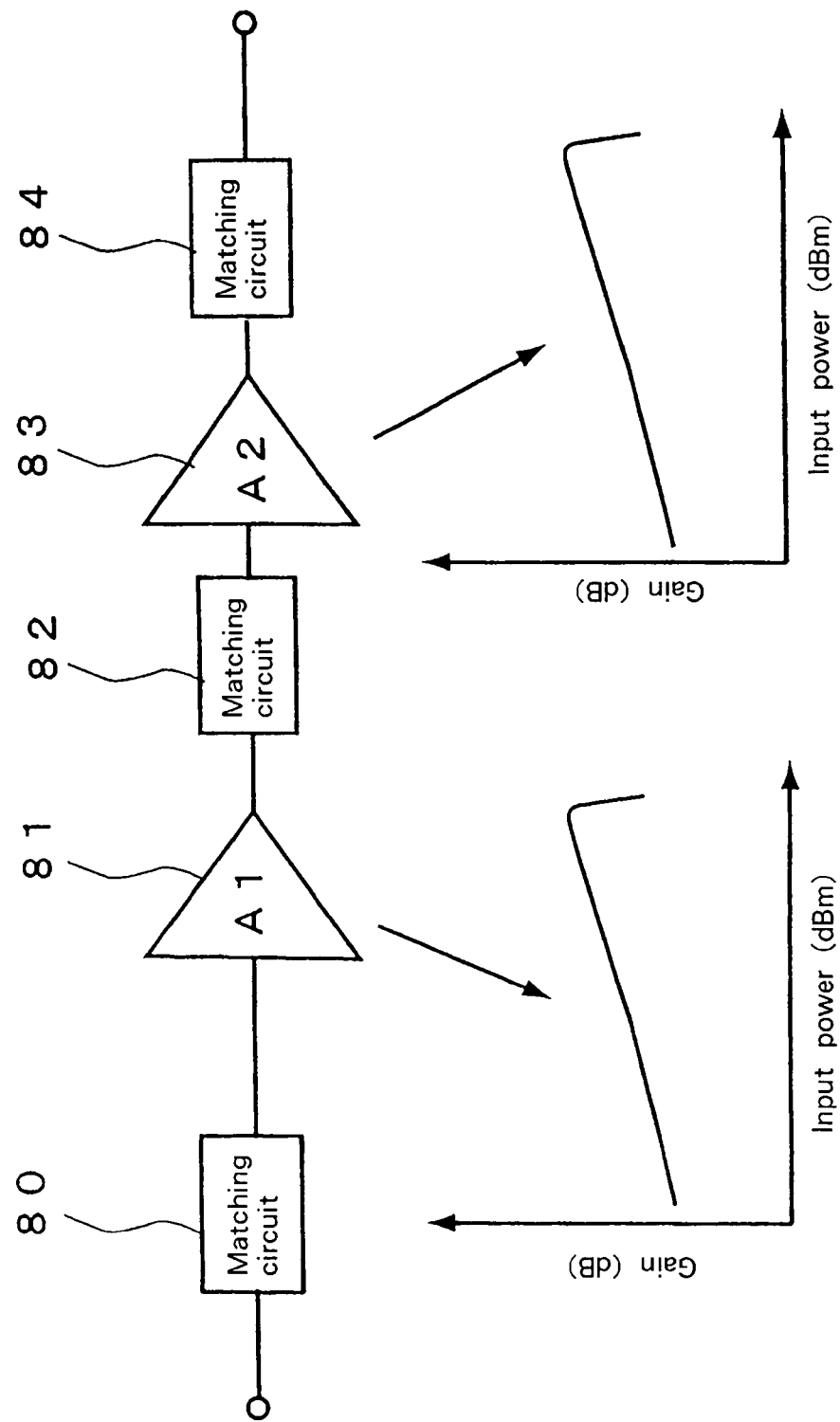

FIGS. 37 and 38 are diagrams each illustrating a multi-stage amplifier showing a seventh embodiment of the present invention. In FIG. 38, 80, 82, 84 designate matching circuits, and 81, 83 designate amplification stages. As illustrated in FIG. 38, in a multi-stage amplifier having two or more amplification stages which have a gain expansion characteristic that presents an increase in gain in response to an increase in input power or output power within a certain range of the input power or output power, an amplitude compression mechanism at high frequencies is provided at the input of a stage other than the final stage.

The amplification stage having the amplitude compression mechanism is not used at the final stage because an amplifying transistor at the final stage generally has the largest size of all amplifying transistors and therefore presents a low input impedance, so that it is difficult to control such that IM3 is in opposite phase to the basic wave.

Figure 39:
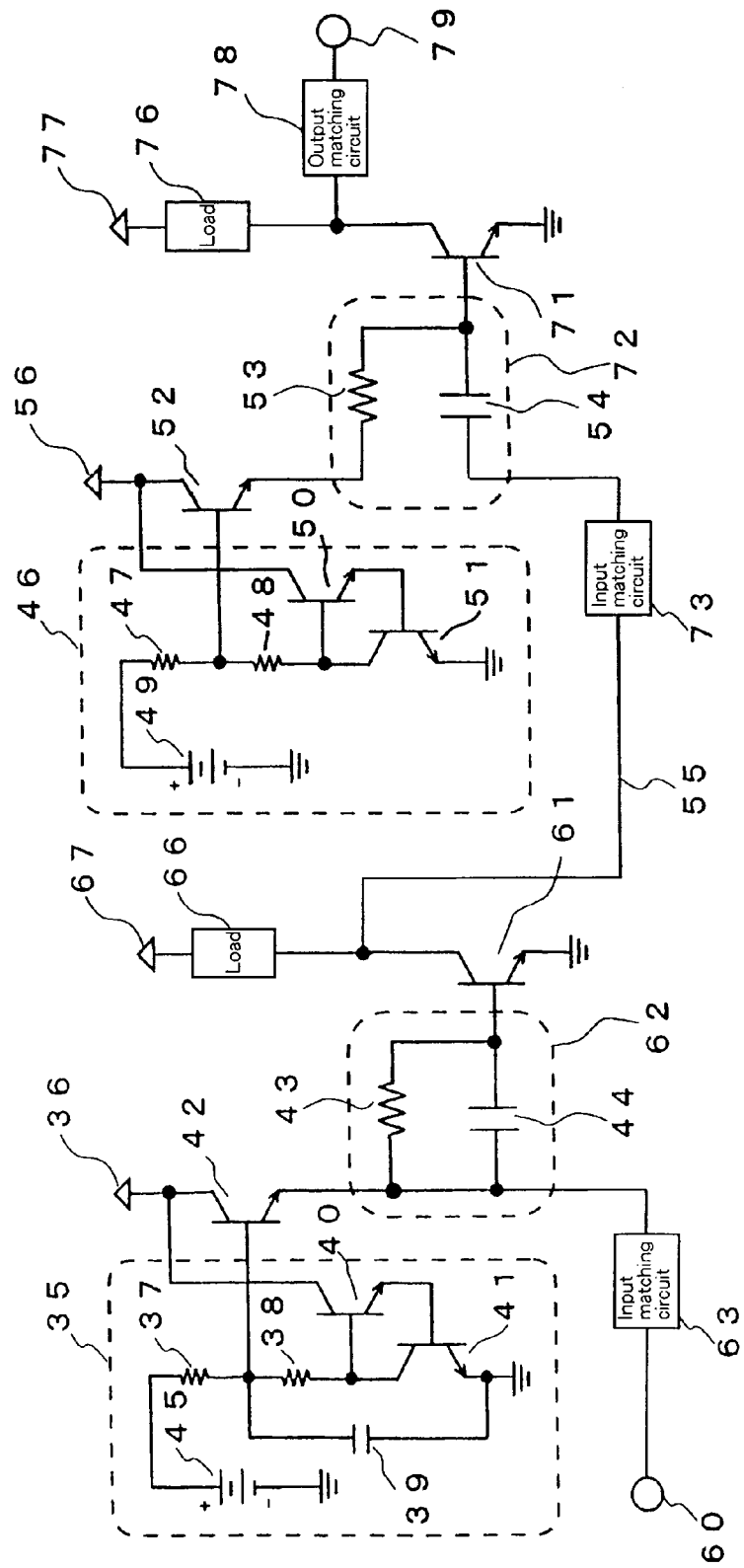
Figure 40:
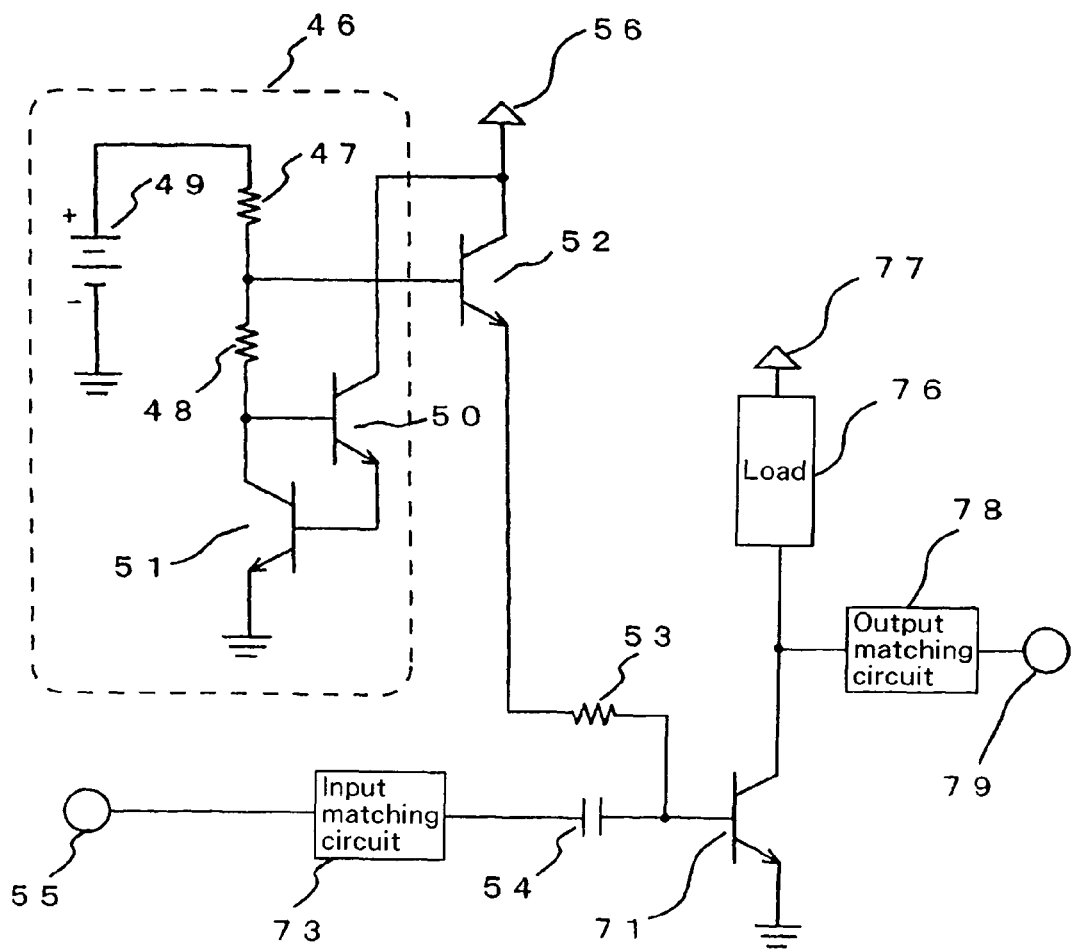
Figure 41:
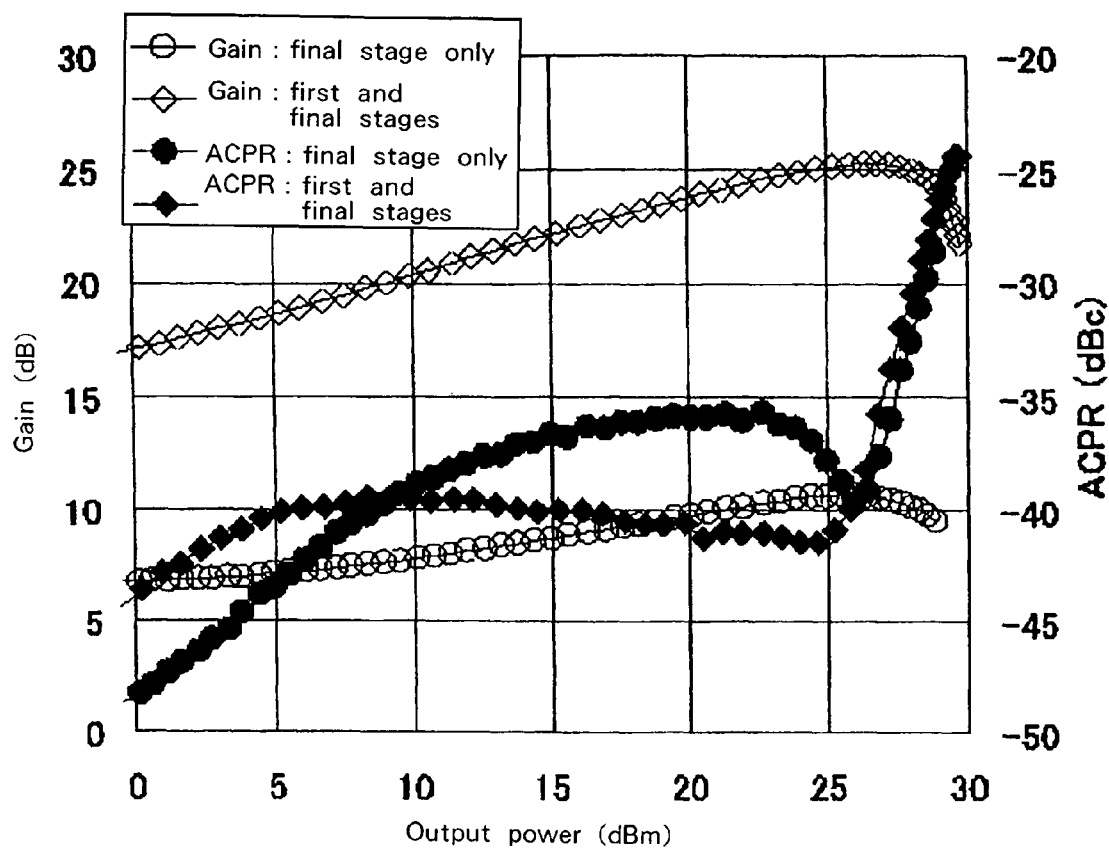

FIGS. 39, 40, and 41 are diagrams for describing this embodiment. This embodiment employs an amplification stage identical in configuration (FIG. 25) to the first embodiment as the amplification stage in which the amplitude compression mechanism at high frequencies is provided at the input. Three unit HBT's, each having an emitter area of 180 μm² and connected in parallel, were used for first-stage amplifying transistor 61, resistor 43 of impedance element 62 was comprised of three 250Ω resistors connected in parallel, which also served as a ballast resistor of transistor 61, and three 0.8-pF capacitances were connected in parallel to form capacitance 44 of impedance element 62. An HBT having an emitter area of 60 μm² was used for bias supply transistor 42.

24 unit HBT's, each having an emitter area of 180 μm² and connected in parallel, were used for final-stage amplifying transistor 71, resistor 53 of impedance element 72 was comprised of 24 resistors of 250Ω connected in parallel, which also served as a ballast resistor of the transistor, and 24 0.8-pF capacitances were connected in parallel to form capacitance 54 of impedance element 72. Two HBT's each having an emitter area of 120 μm² were used for bias supply transistor 52. HBT's having an emitter area of 30 μm² were used for the transistors of reference power supplies 35 and 46. A 3-pF capacitance was used for capacitance 39 in reference power supply 35. Transmission lines, each having a length of one quarter wavelength with respect to the basic wave, were used for loads 66, 67, and 3.5-V regulated voltage sources were used for collector power supplies 67, 77 and bias power supplies 36, 56.

FIG. 41 is a diagram showing the gain and a change in ACPR with respect to the output power, resulting from a measurement, with a W-CDMA signal applied to the amplifier, wherein parameters of reference power supplies 35, 46 and control power supplies 45, 49 were set such that the collector current of amplifying transistor 61 was 5 mA when no input signal was applied from input terminal 60, and the collector current of amplifying transistor 71 was 15 mA when no input signal was likewise applied from input terminal 55. FIG. 41 also shows the gain and a change in ACPR with respect to the output power, which were measured only in the amplifier at the final stage, illustrated in FIG. 40, for purposes of comparison.

In FIG. 41, ACPR, when measured in the multi-stage amplifier at the first stage and at the final stage, is kept lower than ACPR when measured only in the amplifier at the final stage in a range of the output power from 10 dBm to 25 dBm. In other words, distortions at the first stage and final stage are cancelled out in this power range. When the gain only at the final stage is compared with the gain at the first stage and final stage, the difference in gain increases in a range of the output power from 10 dBm to 25 dBm, so that it is understood that the gain is extended both at the first stage and final stage in this power range.

In the foregoing, in which GaAs hetero hetero-junction bipolar transistors (HBT), which excel in high frequency characteristics, have been employed for the transistors, it goes without saying that similar effects can be produced as well using other bipolar transistors such as SiGe-HBT, Si-bipolar and the like.

Also, while the reference power supplies of the bias circuits employed above are those described in Japanese Patent No. 3377765 and JP-A-2002-9559, it goes without saying that similar effects can be produced as well using any circuit which acts as a reference power supply, such as a reference power supply using a two-layered diode or an avalanche diode, another current mirror circuit and the like.

Also, while the reference power supply is grounded through a 2-pF capacitance to present a sufficiently low impedance in a high frequency range, similar effects can be produced as well when a different capacitance value is provided, or an element other than the capacitance (for example, an active capacitor) is used to reduce a high-frequency impedance.

The invention claimed is:

1. An amplifier comprising:
    a gain expansion characteristic which presents an increase in gain in response to an increase in input power or output power in a certain range of the input power or the output power, and
    a mechanism which compresses a larger instantaneous amplitude value and compresses to a lesser degree an instantaneous amplitude value which is smaller relative to said larger instantaneous amplitude value, when said instantaneous amplitude values are provided as inputs to said amplifier.

2. An amplifier comprising:
    a gain expansion characteristic which presents an increase in gain in response to an increase in input power or output power in a certain range of the input power or the output power, and
    an emitter grounded amplifier circuit comprising a first bipolar transistor has a base terminal to which an input matching circuit and a cathode of a first diode for supplying a bias voltage are connected through a first impedance element which does not block a direct current, and said first diode has an anode which is connected to a reference power supply which presents a sufficiently low impedance at high frequencies.

3. The amplifier according to claim 2, wherein:
    said first diode has a cathode area which is 1/10 or more the size of an emitter area of said first bipolar transistor.

4. The amplifier according to any of claims 2 and 3, wherein:
    said first diode comprises a base-emitter of a second bipolar transistor which has a collector connected to a bias power supply, an emitter connected to said first impedance element, and a base connected to a reference voltage terminal.

5. An amplifier comprising:
    a gain expansion characteristic which presents an increase in gain in response to an increase in input power or output power in a certain range of the input power or the output power, and
    a first diode is arranged in a forward direction between a base terminal of an emitter grounded amplifier circuit comprising a first bipolar transistor and a reference voltage terminal for supplying a base bias voltage to the base terminal, and a circuit comprising a second diode connected in series with a first impedance element which does not block a direct current is connected in parallel with said first diode such that said second diode is oriented in the forward direction.

6. The amplifier according to claim 5, wherein:
    said second diode comprises a base-emitter of a third bipolar transistor which has a collector connected to a bias power supply, an emitter connected to said first impedance element, and a base connected to the reference voltage terminal.

7. The amplifier according to any of claims 5 and 6, wherein:
    said first diode comprises a base-emitter of a second bipolar transistor which has a collector connected to the bias power supply, an emitter connected to said first impedance element, and a base connected to the reference voltage terminal.

8. The amplifier according to any of claims 2 to 6, wherein:
said first impedance element comprises a circuit which is comprised of a capacitance and a resistor in parallel.

9. The amplifier according to any of claims 2 to 6, wherein:
a high-frequency impedance, when said emitter grounded amplifier circuit is viewed from an input terminal, is higher than a high-frequency impedance, when a bias supply circuit is viewed from the input terminal.

10. A multi-stage amplifier comprising:
at least two or more amplification stages, each stage having a gain expansion characteristic which presents an increase in gain in response to an increase in input power or output power in a certain range of the input power or the output power, and
in a power range in which the gain expansion characteristic is provided, at least one stage of said amplification stages other than a final stage has an output characteristic such that when said amplifier is applied with two wave signals at close frequencies, a phase of a third-order inter-modulation distortion rotates 90 degrees or more from the phase of the two wave signals at a time when the two wave signals match in phase.

11. A multi-stage amplifier comprising:
at least two or more amplification stages, each of which have a gain expansion characteristic which presents an increase in gain in response to an increase in input power or output power in a certain range of the input power or the output power, and
a mechanism provided at an input of at least one stage of said at least two or more amplification stages which compresses a larger instantaneous amplitude value and compresses to a lesser degree an instantaneous amplitude value which is smaller relative to said larger instantaneous amplitude value, when said instantaneous amplitude values are provided as inputs to said at least one stage.

12. A multi-stage amplifier comprising:
at least two or more amplification stages, each of which have a gain expansion characteristic which presents an increase in gain in response to an increase in input power or output power in a certain range of the input power or the output power, and
an amplifier circuit of at least one stage of said amplification stages other than a final stage comprises an emitter grounded amplifier circuit including a first bipolar transistor which has a base terminal connected to an input matching circuit and to a cathode of a first diode for supplying a bias, wherein said first diode has an anode connected to a reference power supply which presents a sufficiently low impedance at high frequencies.

13. The multi-stage amplifier according to claim 12, wherein:
said first diode has a cathode area which is 1/10 or more as large as an emitter area of said first bipolar transistor.

14. The multi-stage amplifier according to any of claims 12 and 13, further comprising:
a first impedance element which does not block a direct current in series with the base terminal of said emitter grounded amplifier circuit comprising the first bipolar transistor.

15. The multi-stage amplifier according to claim 14, wherein said first impedance element a capacitance and a resistor connected in parallel.

16. The multi-stage amplifier according to claim 14, wherein said first diode comprises a base-emitter of a second bipolar transistor which has a collector connected to a bias power supply, an emitter connected to a first impedance element, and a base connected to a reference voltage terminal.

17. A multi-stage amplifier comprising:
at least two or more amplification stages, each of which have a gain expansion characteristic which presents an increase in gain in response to an increase in input power or output power in a certain range of the input power or the output power, and
an amplifier circuit of at least one stage of said amplification stages other than a final stage comprises a first diode arranged in a forward direction between a base terminal of an emitter grounded amplifier circuit comprising a first bipolar transistor and a reference voltage terminal for supplying a base bias voltage to the base terminal, and a circuit having a second diode connected in series with a first impedance element, connected in parallel with said first diode such that said second diode is oriented in the forward direction.

18. The multi-stage amplifier according to claim 17, wherein:
said second diode comprises a base-emitter of a third bipolar transistor which has a collector connected to a bias power supply, an emitter connected to said first impedance element, and a base connected to the reference voltage terminal.

19. The multi-stage amplifier according any of claims 17 and 18, further comprising a first impedance element comprising a capacitance and a resistor connected in parallel.

20. The multi-stage amplifier according to claim 18, wherein said first diode comprises a base-emitter of a second bipolar transistor which has a collector connected to the bias power supply, an emitter connected to said first impedance element, and a base connected to the reference voltage terminal.

21. The multi-stage amplifier according to any of claims 12, 13, 17 and 18, wherein said amplifier circuit provides, connected to its input terminal, a mechanism for compressing amplitude, and presents an impedance, when said emitter grounded amplifier circuit is viewed from an input terminal, that is higher than an impedance, when a bias supply circuit is viewed from the input terminal.

22. The multi-stage amplifier according to claim 21, wherein another amplification stage is provided after said amplifier circuit having the mechanism for compressing amplitude connected to its input terminal, said other amplification stage comprising an emitter grounded amplifier circuit and a bias supply circuit for supplying a base bias voltage to a base terminal of said emitter grounded amplifier circuit of said other amplification stage, wherein said other amplification stage presents an impedance, when said emitter grounded amplifier circuit said other amplification stage is viewed from an input terminal, that is higher than an impedance, when said bias supply circuit is viewed from the input terminal.

23. The multi-stage amplifier according to claim 17, wherein said first diode comprises a base-emitter of a second bipolar transistor which has a collector connected to a bias power supply, an emitter connected to the first impedance element, and a base connected to the reference voltage terminal.

* * * * *